(12) United States Patent
Rohe et al.

(10) Patent No.: US 8,415,973 B2
(45) Date of Patent: Apr. 9, 2013

(54) CONFIGURABLE INTEGRATED CIRCUIT WITH BUILT-IN TURNS

(75) Inventors: Andre Rohe, Mountain View, CA (US); Steven Teig, Menlo Park, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

(21) Appl. No.: 13/189,486

(22) Filed: Jul. 22, 2011

(65) Prior Publication Data

US 2012/0062278 A1 Mar. 15, 2012

Related U.S. Application Data

(63) Continuation of application No. 12/773,012, filed on May 3, 2010, now Pat. No. 7,994,817, which is a continuation of application No. 11/945,221, filed on Nov. 26, 2007, now Pat. No. 7,737,722, which is a continuation of application No. 10/882,945, filed on Jun. 30, 2004, now Pat. No. 7,312,630.

(51) Int. Cl.
*H03K 19/173* (2006.01)
*G06F 17/50* (2006.01)

(52) U.S. Cl. .......................................... 326/38; 716/101

(58) Field of Classification Search ............... 326/37–41, 326/47, 101; 716/100, 110, 116, 118
See application file for complete search history.

(56) References Cited

U.S. PATENT DOCUMENTS

| | | | |
|---|---|---|---|
| 4,873,459 A | 10/1989 | El Gamal et al. | |
| 5,155,389 A | 10/1992 | Furtek | |
| 5,224,065 A | 6/1993 | Yoshida | |
| 5,245,575 A | 9/1993 | Sasaki et al. | |
| 5,349,250 A | 9/1994 | New | |
| 5,357,153 A | 10/1994 | Chiang et al. | |
| 5,365,125 A | 11/1994 | Goetting et al. | |
| 5,369,622 A | 11/1994 | McLaury | |
| 5,386,156 A | 1/1995 | Britton et al. | |
| 5,426,378 A | 6/1995 | Ong | |
| 5,521,835 A | 5/1996 | Trimberger | |
| 5,532,958 A | 7/1996 | Jiang et al. | |
| 5,546,018 A | 8/1996 | New et al. | |
| 5,552,721 A | 9/1996 | Gould | |
| 5,596,743 A | 1/1997 | Bhat et al. | |
| 5,600,263 A | 2/1997 | Trimberger et al. | |

(Continued)

OTHER PUBLICATIONS

Portions of prosecution history of U.S. Appl. No. 10/882,713, Feb. 21, 2007, Rohe, Andre, et al.

(Continued)

*Primary Examiner* — Shawki Ismail
*Assistant Examiner* — Dylan White
(74) *Attorney, Agent, or Firm* — Adeli & Tollen LLP

(57) ABSTRACT

Some embodiments of the invention provide an integrated circuit ("IC") that includes numerous configurable nodes arranged in an array having several rows and columns. In some embodiments, the configurable nodes include a first group of configurable aligned along a particular direction and a second group of configurable nodes aligned along a different direction. The IC also includes a set of direct offset turn connections arranged across the node array in a repetitive nested architecture. Each direct offset turn connection connects a node from the first group of configurable nodes to a node from the second group of configurable nodes. Each direct offset turn connection includes at least two wire segments that are arranged in at least two different directions and intersect to define a turn. No direct offset turn connection overlaps with another direct offset turn connection.

20 Claims, 26 Drawing Sheets

U.S. PATENT DOCUMENTS

| | | | |
|---|---|---|---|
| 5,610,829 A * | 3/1997 | Trimberger | 716/117 |
| 5,629,637 A | 5/1997 | Trimberger et al. | |
| 5,631,578 A | 5/1997 | Clinton et al. | |
| 5,646,544 A | 7/1997 | Iadanza | |
| 5,646,545 A | 7/1997 | Trimberger et al. | |
| 5,659,484 A | 8/1997 | Bennett et al. | |
| 5,682,107 A | 10/1997 | Tavana et al. | |
| 5,692,147 A | 11/1997 | Larsen et al. | |
| 5,694,057 A | 12/1997 | Gould | |
| 5,701,441 A | 12/1997 | Trimberger | |
| 5,719,889 A | 2/1998 | Iadanza | |
| 5,732,246 A | 3/1998 | Gould et al. | |
| 5,737,235 A | 4/1998 | Kean et al. | |
| 5,740,069 A | 4/1998 | Agrawal et al. | |
| 5,745,422 A | 4/1998 | Iadanza | |
| 5,745,734 A | 4/1998 | Craft et al. | |
| 5,761,483 A | 6/1998 | Trimberger | |
| 5,764,954 A | 6/1998 | Fuller et al. | |
| 5,768,178 A | 6/1998 | McLaury | |
| 5,777,360 A | 7/1998 | Rostoker et al. | |
| 5,796,268 A | 8/1998 | Kaplinsky | |
| 5,802,003 A | 9/1998 | Iadanza et al. | |
| 5,815,726 A | 9/1998 | Cliff | |
| 5,825,662 A | 10/1998 | Trimberger | |
| 5,883,525 A * | 3/1999 | Tavana et al. | 326/39 |
| 5,889,411 A | 3/1999 | Chaudhary | |
| 5,914,616 A | 6/1999 | Young et al. | |
| 5,914,906 A | 6/1999 | Iadanza et al. | |
| 5,944,813 A | 8/1999 | Trimberger | |
| 5,982,655 A | 11/1999 | Doyle | |
| 6,002,991 A | 12/1999 | Conn, Jr. | |
| 6,018,559 A | 1/2000 | Azegami et al. | |
| 6,023,421 A | 2/2000 | Clinton et al. | |
| 6,038,192 A | 3/2000 | Clinton et al. | |
| 6,044,031 A | 3/2000 | Iadanza et al. | |
| 6,054,873 A | 4/2000 | Laramie | |
| 6,069,490 A | 5/2000 | Ochotta et al. | |
| 6,075,745 A | 6/2000 | Gould et al. | |
| 6,084,429 A | 7/2000 | Trimberger | |
| 6,086,631 A | 7/2000 | Chaudhary et al. | |
| 6,091,263 A | 7/2000 | New et al. | |
| 6,091,645 A | 7/2000 | Iadanza | |
| 6,097,212 A | 8/2000 | Agrawal et al. | |
| 6,107,821 A | 8/2000 | Kelem et al. | |
| 6,110,223 A | 8/2000 | Southgate et al. | |
| 6,118,707 A | 9/2000 | Gould et al. | |
| 6,130,854 A | 10/2000 | Gould et al. | |
| 6,134,154 A | 10/2000 | Iwaki et al. | |
| 6,140,839 A | 10/2000 | Kaviani et al. | |
| 6,150,838 A | 11/2000 | Wittig et al. | |
| 6,163,168 A | 12/2000 | Nguyen et al. | |
| 6,169,416 B1 | 1/2001 | Eaton et al. | |
| 6,172,521 B1 | 1/2001 | Motomura | |
| 6,173,379 B1 | 1/2001 | Poplingher et al. | |
| 6,175,247 B1 | 1/2001 | Scalera et al. | |
| 6,184,707 B1 | 2/2001 | Norman et al. | |
| 6,184,709 B1 | 2/2001 | New | |
| 6,188,240 B1 | 2/2001 | Nakaya | |
| 6,205,076 B1 | 3/2001 | Wakayama et al. | |
| 6,233,191 B1 | 5/2001 | Gould et al. | |
| 6,255,849 B1 | 7/2001 | Mohan | |
| 6,275,064 B1 | 8/2001 | Agrawal et al. | |
| 6,292,019 B1 | 9/2001 | New et al. | |
| 6,326,651 B1 | 12/2001 | Manabe | |
| 6,326,807 B1 | 12/2001 | Veenstra et al. | |
| 6,346,824 B1 | 2/2002 | New | |
| 6,348,813 B1 | 2/2002 | Agrawal et al. | |
| 6,369,610 B1 | 4/2002 | Cheung et al. | |
| 6,381,732 B1 | 4/2002 | Burnham et al. | |
| 6,396,303 B1 * | 5/2002 | Young | 326/39 |
| 6,462,577 B1 | 10/2002 | Lee et al. | |
| 6,469,540 B2 | 10/2002 | Nakaya | |
| 6,480,954 B2 | 11/2002 | Trimberger et al. | |
| 6,487,709 B1 | 11/2002 | Keller et al. | |
| 6,490,707 B1 | 12/2002 | Baxter | |
| 6,496,918 B1 | 12/2002 | Dehon et al. | |
| 6,515,509 B1 | 2/2003 | Baxter | |
| 6,526,559 B2 | 2/2003 | Schiefele et al. | |
| 6,529,040 B1 | 3/2003 | Carberry et al. | |
| 6,545,501 B1 | 4/2003 | Bailis et al. | |
| 6,573,749 B2 | 6/2003 | New et al. | |
| 6,593,771 B2 | 7/2003 | Bailis et al. | |
| 6,601,227 B1 | 7/2003 | Trimberger | |
| 6,603,330 B1 | 8/2003 | Snyder | |
| 6,611,153 B1 | 8/2003 | Lien et al. | |
| 6,629,308 B1 | 9/2003 | Baxter | |
| 6,636,070 B1 | 10/2003 | Altaf | |
| 6,642,744 B2 | 11/2003 | Or-Bach et al. | |
| 6,650,142 B1 | 11/2003 | Agrawal et al. | |
| 6,667,635 B1 | 12/2003 | Pi et al. | |
| 6,668,361 B2 | 12/2003 | Bailis et al. | |
| 6,675,309 B1 | 1/2004 | Baxter | |
| 6,686,769 B1 | 2/2004 | Nguyen et al. | |
| 6,703,861 B2 | 3/2004 | Ting | |
| 6,714,041 B1 | 3/2004 | Darling et al. | |
| 6,731,133 B1 | 5/2004 | Feng et al. | |
| 6,732,068 B2 | 5/2004 | Bauer et al. | |
| 6,806,730 B2 | 10/2004 | Bailis et al. | |
| 6,809,979 B1 | 10/2004 | Tang | |
| 6,810,513 B1 | 10/2004 | Vest | |
| 6,829,756 B1 | 12/2004 | Trimberger | |
| 6,831,479 B2 | 12/2004 | Lo | |
| 6,838,902 B1 | 1/2005 | Elftmann et al. | |
| 6,851,101 B1 | 2/2005 | Kong et al. | |
| 6,882,182 B1 | 4/2005 | Conn et al. | |
| 6,920,627 B2 | 7/2005 | Blodget et al. | |
| 6,924,663 B2 | 8/2005 | Masui et al. | |
| 6,931,616 B2 * | 8/2005 | Teig et al. | 716/129 |
| 6,937,535 B2 | 8/2005 | Ahn et al. | |
| 6,956,399 B1 | 10/2005 | Bauer | |
| 6,992,505 B1 | 1/2006 | Zhou | |
| 6,998,872 B1 | 2/2006 | Chirania et al. | |
| 7,010,667 B2 | 3/2006 | Vorbach et al. | |
| 7,028,281 B1 | 4/2006 | Agrawal et al. | |
| 7,075,333 B1 | 7/2006 | Chaudhary et al. | |
| 7,109,752 B1 | 9/2006 | Schmit et al. | |
| 7,126,372 B2 | 10/2006 | Vadi et al. | |
| 7,126,856 B2 | 10/2006 | Sun et al. | |
| 7,129,746 B1 | 10/2006 | Balasubramanian et al. | |
| 7,129,747 B1 | 10/2006 | Jang et al. | |
| 7,138,827 B1 | 11/2006 | Trimberger | |
| 7,143,329 B1 | 11/2006 | Trimberger et al. | |
| 7,145,361 B1 | 12/2006 | Rohe et al. | |
| 7,154,299 B2 | 12/2006 | Swami et al. | |
| 7,193,438 B1 | 3/2007 | Rohe et al. | |
| 7,205,791 B1 | 4/2007 | Lee et al. | |
| 7,212,448 B1 | 5/2007 | Trimberger | |
| 7,259,587 B1 | 8/2007 | Schmit et al. | |
| 7,282,950 B1 | 10/2007 | Schmit et al. | |
| 7,284,222 B1 | 10/2007 | Rohe et al. | |
| 7,295,037 B2 | 11/2007 | Schmit et al. | |
| 7,312,630 B2 | 12/2007 | Rohe et al. | |
| 7,468,614 B2 | 12/2008 | Rohe et al. | |
| 7,480,885 B2 * | 1/2009 | Frankle et al. | 716/129 |
| 7,518,402 B2 | 4/2009 | Schmit et al. | |
| 7,532,032 B2 | 5/2009 | Schmit et al. | |
| 7,557,609 B2 | 7/2009 | Rohe et al. | |
| 7,573,296 B2 | 8/2009 | Schmit et al. | |
| 7,576,564 B2 | 8/2009 | Schmit et al. | |
| 7,737,722 B2 | 6/2010 | Rohe et al. | |
| 7,839,166 B2 | 11/2010 | Schmit et al. | |
| 7,849,434 B2 | 12/2010 | Rohe et al. | |
| 7,994,817 B2 | 8/2011 | Rohe et al. | |
| 2001/0007428 A1 | 7/2001 | Young et al. | |
| 2002/0008541 A1 | 1/2002 | Young et al. | |
| 2002/0010853 A1 | 1/2002 | Trimberger et al. | |
| 2002/0113619 A1 | 8/2002 | Wong | |
| 2002/0125910 A1 | 9/2002 | New et al. | |
| 2002/0125914 A1 | 9/2002 | Kim | |
| 2002/0161568 A1 | 10/2002 | Sample et al. | |
| 2002/0163357 A1 | 11/2002 | Ting | |
| 2003/0042931 A1 | 3/2003 | Ting | |
| 2003/0080777 A1 | 5/2003 | Baxter | |
| 2003/0110430 A1 | 6/2003 | Bailis et al. | |
| 2003/0141898 A1 | 7/2003 | Langhammer et al. | |
| 2004/0010767 A1 | 1/2004 | Agrawal et al. | |
| 2004/0103265 A1 | 5/2004 | Smith | |

| 2004/0196066 | A1 | 10/2004 | Ting |
| 2004/0233758 | A1 | 11/2004 | Kim et al. |
| 2005/0007155 | A1 | 1/2005 | Young |
| 2005/0134308 | A1 | 6/2005 | Okada et al. |
| 2006/0186920 | A1 | 8/2006 | Feng et al. |
| 2007/0143577 | A1 | 6/2007 | Smith |
| 2011/0163781 | A1 | 7/2011 | Rohe et al. |
| 2011/0199117 | A1* | 8/2011 | Hutchings et al. ............. 326/38 |
| 2011/0202586 | A1 | 8/2011 | Teig et al. |

OTHER PUBLICATIONS

Portions of prosecution history of U.S. Appl. No. 11/675,620, Sep. 29, 2008, Rohe, Andre, et al.
Portions of prosecution history of U.S. Appl. No. 10/882,945, Nov. 8, 2007, Rohe, Andre, et al.
Portions of prosecution history of U.S. Appl. No. 11/945,221, Apr. 26, 2010, Rohe, Andre, et al.
Portions of prosecution history of U.S. Appl. No. 12/773,012, Jun. 27, 2011, Rohe, Andre, et al.
Portions of prosecution history of U.S. Appl. No. 10/882,848, Jul. 19, 2006, Rohe, Andre, et al.
Portions of prosecution history of U.S. Appl. No. 11/558,870, Feb. 24, 2009, Rohe, Andre, et al.
Portions of prosecution history of U.S. Appl. No. 10/883,502, Jul. 26, 2007, Rohe, Andre, et al.
Portions of prosecution history of U.S. Appl. No. 11/852,320, Oct. 22, 2010, Rohe, Andre, et al.
Portions of prosecution history of U.S. Appl. No. 12/957,389, Feb. 15, 2012, Rohe, Andre, et al.
Portions of prosecution history of U.S. Appl. No. 11/082,193, Jun. 28, 2007, Schmit, Herman et al.
Portions of prosecution history of U.S. Appl. No. 11/868,959, Apr. 3, 2009, Schmit, Herman, et al.
Portions of prosecution history of U.S. Appl. No. 11/082,225, Jul. 2, 2009, Schmit, Herman, et al.
Portions of prosecution history of U.S. Appl. No. 11/081,861, Jul. 12, 2007, Schmit, Herman et al.
Portions of prosecution history of U.S. Appl. No. 11/775,218, Feb. 3, 2009, Schmit, Herman, et al.
Portions of prosecution history of U.S. Appl. No. 11/082,228, Jun. 6, 2007, Schmit, Herman et al.
Portions of prosecution history of U.S. Appl. No. 11/856,214, Oct. 8, 2010, Schmit, Herman et al.
Portions of prosecuton history of U.S. Appl. No. 12/949,775, Feb. 13, 2012, Schmit, Herman et al.
"§3 Programmable Logic Devices," *Digital System Design*, 2001 Month N/A, slides 3.1-3.28.
"Design for Low Power in Actel Antifuse FPGAs" Actel Application Note, 2000 Actel Corporation, Sep. 2000, pp. 1-8.
"The Effect of SRAM Table Sharing and Cluster Size on FPGA Area," NPL Date Unknown, pp. 1-10.
"The Xilinx Virtex Series FPGA," Jan. 22, 2001, slides 1-22.
"Unifying Sequential and Spatial Computing with a Single Instruction Set Architecture,"*ISCA '04*, Jun. 19-23, 2004, ACM, Munchen, Oberbayern, Germany.
Agrawal, O., et al., "An Innovative, Segmented High Performance FPGA Family with Variable-Grain-Architecture and Wide-gating Functions," *FPGA 99*, Feb. 1999, pp. 17-26, ACM, Monterey, CA, USA.
Ahmed, E., et al., "The Effect of LUT and Cluster Size on Deep-Submicron FPGA Performance and Density," *FPGA 2000*, Feb. 2000, ACM, Monterey, CA, USA.
Altera Corp "6 DSP Blocks in Stratix II Devices" *SII52006-1.0*, Feb. 2004 pp. 1-32.
Altera, "Stratix II DSP Performance," *White Paper*, Feb. 2004, pp. 1-9, ver. 1.0, Altera Corporation, San Jose, CA.
Andraka Consulting Group, Inc., "Multiplication in FPGAs," http://www.andraka.com/multipli.htm, Jan. 25, 2006, pp. 1-7.
Backus, J., "Can Programming be Liberated from the Von Neumann Style? A Functional Style and its Algebra of Programs," *Communications of the ACM*, Aug. 1978, pp. 613-641, vol. 21, No. 8, ACM.
Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, California.
Butts, M., "Future Directions of Dynamically Reprogrammable Systems," *IEEE 1995 Custom Integrated Circuits Conference*, May 1995, pp. 487-494.
Camposano, R., "The Growing Semiconductor Zoo: ASICs, CSSP, ASSP, ASIP, Structured Arrays, FPGAs, Processor Arrays, Platforms . . . and Other Animalia," Aug. 29, 2003, pp. 1-74, Synopsys, Inc.
Caspi, E., et al., "A Streaming Multi-Threaded Model," *MSP-3*, Dec. 2, 2001, pp. 1-23.
Caspi, E., et al., "Stream Computations Organized for Reconfigurable Execution (SCORE): Introduction and Tutorial," Aug. 25, 2000, pp. 1-31, Version 1.0.
Chiricescu, S., et al., "Morphable Multipliers," *FPL 2002, LNCS 2438*, Sep. 2002, pp. 647-656, Springer-Verlag Berlin Heidelberg.
Compton, K., et al., "An Introduction to Reconfigurable Computing," *IEEE Computer*, Apr. 2000.
Compton, K., et al., "Reconfigurable Computing: A Survey of Systems and Software," *ACM Computing Surveys*, Jun. 2002, pp. 171-210, vol. 34, No. 2, ACM, New York, NY.
Cong. J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.
Davare, A., et al., "The Best of Both Worlds: The Efficient Asynchronous Implementation of Synchronous Specifications," *DAC '04*, Jun. 7-11, 2004, ACM, San Diego, California, USA.
Dehon, A., "Balancing Interconnect and Computation in a Reconfigurable Computing Array (or, why don't you really want 100% LUT utilization)," *Proceedings of the International Symposium on Field Programmable Gate Arrays*, Feb. 1999, pp. 125-134.
Dehon, A., "DPGA Utilization and Application," *Proceedings of the 1996 ACM Fourth International Symposium on Field-Programmable Gate Arrays FPGA*, Feb. 11-13, 1996, Monterey, California, USA.
Dehon, A., "Dynamically Programmable Gate Arrays: A Step Toward Increased Computational Density," *Proceedings of the Fourth Canadian Workshop on Field-Programmable Devices*, May 1996, pp. 47-54.
Dehon, A., "Reconfigurable Architectures for General-Purpose Computing," *A.I. Technical Report No. 1586*, Oct. 1996, pp. i-353.
Dehon, A., "The Density Advantage of Configurable Computing," IEEE, Apr. 2000, pp. 41-49.
Dehon, A., "Transit Note #121: Notes on Programmable Interconnect," *M.I.T. Transit Project*, Feb. 1995, pp. 1-13.
Dehon, A., et al., "Design Patterns for Reconfigurable Computing," *Proceedings of the IEEE Symposium on Field-Programmable Custom Computing Machines*, Apr. 2004.
Dehon, A., et al., "DPGA-Coupled Microprocessors: Commodity ICs for the Early $21^{st}$ Century," *FCCM '94-IEEE Workshop on FPGAs for Custom Computing Machines*, Apr. 1994, Napa Valley, California, USA.
Dehon, A., et al., "Reconfigurable Computing: What, Why, and Implications for Design Automation," *DAC 1999*, Jun. 1999, ACM, New Orleans, Louisiana.
Enzler, R., et al., "Virtualizing Hardware with Multi-Context Reconfigurable Arrays," *Lecture Notes in Computer Science*, Sep. 2003, pp. 151-160.
Gayasen, A., et al., "Reducing Leakage Energy in FPGAs Using Region-Constrained Placement," *FPGA '04*, Feb. 22-24, 2004, pp. 51-58, ACM, Monterey, California, USA.
George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California*, Berkeley, Fall 2000 Month N/A, pp. 1-190.
Giraud-Carrier, C., "A Reconfigurable Data Flow Machine for Implementing Functional Programming Languages", *SIGPLAN Notices*, Sep. 1994, vol. 29 No. 9, pp. 22-28.
Goldstein, S.C., et al., "PipeRench: A Coprocessor for Streaming Multimedia Acceleration", *In International Symposium on Computer Architecture (ISCA)*, pp. 28-39, May 1999.

Goldstein, S.C., et al., "PipeRench: A Reconfigurable Architecture and Compiler," IEEE, Apr. 2000, pp. 70-77.
Hauck, S., et al., "High-Performance Carry Chains for FPGAs," *FPGA 98*, Feb. 1998, pp. 223-233, ACM, Monterey, CA, USA.
Hauck, S., et al., "Montage: An FPGA for Synchronous and Asynchronous Circuits," *Field-Programmable Gate Arrays: Architectures and Tools for Rapid Prototyping*, 1993 Month N/A, Springer-Verlag, Berlin.
Hauck, S., et al., "Totem: Domain-Specific Reconfigurable Logic," *IEEE Transactions on VLSI Systems*, 2006 Month N/A, pp. 1-25.
Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, California.
Hofstee, H.P., "Cell Broadband Engine Architecture from 20,000 Feet," Aug. 24, 2005, pp. 1-6.
Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.
IBM, "Cell Broadband Engine Architecture, Version 1.0," Aug. 8, 2005, pp. 1-319, USA.
IBM, "SPU Application Binary Interface Specification, Version 1.3," *CBEA JSRE Series*, Aug. 1, 2005, pp. iv-26, USA.
IBM, "SPU Assembly Language Specification, Version 1.2," *CBEA JSRE Series*, Aug. 1, 2005, pp. iii-22, USA.
IBM, "SPU C/C++ Language Extensions, Version 2.0" *CBEA JSRE Series*, Aug. 1, 2005, pp. iv-84, USA.
IBM, "Synergistic Processor Unit Instruction Set Architecture, Version 1.0," Aug. 1, 2005, pp. 1-257, USA.
Kaviani, A., et al., "Computational Field Programmable Architecture," *Custom Integrated Circuits Conference, 1998, Proceedings of the IEEE 1998*, May 11-14, 1998.
Kaviani, A., et al., "Hybrid FPGA Architecture," *Proceedings of the 1996 ACM Fourth International Symposium on Field-Programmable Gate Arrays*, Feb. 11-13, 1996, pp. 3-9, Monterey, California, USA.
Keutzer, K., "Overview of *configurable* architectures," Feb. 28, 2002, slides 1-29.
Kocan, F., et al., "Logic Modules with Shared SRAM Tables for Field-Programmable Gate Arrays," *FPL 2004*, Aug./Sep. 2004, pp. 289-300, Springer-Verlag, Berlin Heidelberg.
Lehn, D.I., et al., "Evaluation of Rapid Context Switching on a CSRC Device," *Proceedings of the International Conference on Engineering of Reconfigurable Systems and Algorithms*, Jun. 24-27, 2002.
Lemieux, G., et al., "Generating Highly-Routable Sparse Crossbars for PLDs," *FPGA 2000*, Feb. 2000, ACM, Monterey, California, USA.
Lemieux, G., et al., "Using Sparse Crossbars within LUT Clusters," *FPGA 2001*, Feb. 11-13, 2001, ACM, Monterey, CA.
Lertora, F., et al., "Handling Different Computational Granularity by a Reconfigurable IC Featuring Embedded FPGAs and a Network-On-Chip," *13th Annual IEEE Symposium on Field-Programmable Custom Computing Machines (FCCM 2005)* 2005, Apr. 18-20, 2005.
Lewis, D., et al., "The Stratix-II Routing and Logic Architecture," *Proceedings of the 2005 ACM/SIGDA 13th International Symposium on Field-Programmable Gate Arrays*, pp. 1-22, Feb. 20-22, 2005, Monterey, California, USA.
Ling, A., "The Search for the Optimal FPGA Logic Block," 2001 Month N/A, ACM.
M2000, "FlexEOS Embedded FPGA Cores," 2003 Month N/A, M2000.
Markovskiy, Y., et al., "Analysis of Quasi-Static Scheduling Techniques in a Virtualized Reconfigurable Machine," FPGA '02, Feb. 24-26, 2002, ACM, Monterey, California, USA.
Master, P., "The Next Big Leap in Reconfigurable Systems," *A Technology Vision Whitepaper*, Apr. 28, 2004 but © 2003, pp. 1-8, QuickSilver Technology, Inc., San Jose, California.
Mathstar, Inc., "MathStar FPOA Architecture: A New Approach to High Throughput, Scalable, and Reprogrammable Design," *Technology Overview*, 2003 Month N/A, MathStar, Inc.

Mirsky, E., et al., "MATRIX: A Reconfigurable Computing Architecture with Configurable Instruction Distribution and Deployable Resources," *Proceedings of the IEEE Workshop on FPGAs for Custom Computing Machines*, Apr. 1996.
Mirsky, E., et al., "MATRIX: A Reconfigurable Computing Device with Configurable Instruction Distribution and Deployable Resources (Extended Abstract)," *Hot Chips Symposium 1997*, Aug. 1997.
Morris, K., "Lattice Launches XP: Non-Volatility at the Forefront of FPGA," *FPGA and Programmable Logic Journal*, Mar. 1, 2005, pp. 1-5, Techfocus Media, Inc.
Morris, K., "Rationalizing Reconfigurability: The Importance of Being Programmable," *FPGA and Structured ASIC Journal*, Sep. 27, 2005.
Nelson, B.E., "Reconfigurable Computing: An Introduction and Overview," Sep. 23, 1998, pp. 1-43.
Niedzielski, D., "An Overview of Reconfigurable Computing," NPL Date Unknown.
Ochotta, E.S., et al., "A Novel Predictable Segmented FPGA Routing Architecture," *FPGA 98*, Feb. 1998, pp. 3-11, ACM, Monterey, CA, USA.
Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, California.
Parham!, B., "Part IV: Low-Diameter Architectures," *ECE 254B: Advanced Computer Architecture: Parallel Processing, UCSB*, Spring 2005 Month N/A, slides 1-93, Behrooz Parhami, Santa Barbara, California, USA.
Pedram, M., "IEEE Circuits and Systems Society Distinguished Lecturer Program," 2003-2004 Month N/A.
Perissakis, S., et al., "Embedded DRAM for a Reconfigurable Array," *Proceedings of the 1999 Symposium on VLSI Circuits*, Jun. 1999, slides 1-24.
Perissakis, S., et al., "Embedded DRAM for a Reconfigurable Array," *Proceedings of the 1999 Symposium on VLSI Circuits*, Jun. 1999.
Plunkett, B "In Seach of the SDR Holy Grail," *A Technology Application Whitepaper*, Apr. 28, 2004 but © 2003, pp. 1-7, QuickSilver Technology, Inc., San Jose, California, USA.
Plunkett, B., et al., "Adapt2400 ACM Architecture Overview," *A Technology Whitepaper*, 2001 Month N/A, pp. 1-9, QuickSilver Technology, Inc.
Quicklogic Corp., "Ultra-Low Power FPGA Combining Performance, Density, and Embedded RAM", *Eclipse II Family Data Sheet*, Nov. 2005, pp. 1-92, QuickLogic Corporation, US.
Quicksilver Technology, Inc., "Adapt2000 ACM System Platform," Apr. 2004, pp. 1-39, QuickSilver Technology, Inc., San Jose, California, USA.
Quicksilver Technology, Inc., "InSpire SDK Tool Set," *Product Brief*, 2004 Month N/A, QuickSilver Technology, Inc., San Jose, California, USA.
Quicksilver Technology, Inc., "QS2412 Adaptive Computing Machine," *Product Brief*, 2004 Month N/A, QuickSilver Technology, Inc., San Jose, California, USA.
Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.
Rose, J., "Hard vs. Soft: The Central Question of Pre-Fabricated Silicon," *34th International Symposium on Multiple-Valued Logic (ISMVL '04)*, May 2004, pp. 2-5.
Sambhwani, S., et al., "Implementing W-CDMA Transceiver Structure on an Adaptive Computing Platform," *A Technology Application Whitepaper*, Apr. 28, 2004 but © 2003, pp. 1-12, QuickSilver Technology, Inc., San Jose, California.
Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.
Schaumont, P., et al., "A Quick Safari Through the Reconfiguration Jungle," *38th Design Automation Conference*, Jun. 2001, pp. 172-177, Las Vegas, Nevada, USA.
Schmit, H., "Extra-Dimensional Island-Style FPGAs," *Field Programmable Logic and Application* (FPL 2003), Sep. 2003, pp. 1-10.

Schmit, H., "Extra-Dimensional Island-Style FPGAs," *Field Programmable Logic and Application (FPL 2003)*, Sep. 2003, slides 1-26.

Schmit, H., "Incremental Reconfiguration for Pipelined Applications," *Proceedings of the 5th IEEE Symposium on FPGA-Based Custom Computing Machines*, Apr. 16-18, 1997.

Schmit, H., et al., "FPGA Switch Block Layout and Evaluation," *FPGA '02*, Feb. 24-26, 2002, ACM, Monterey, California, USA.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Programmable Custom Computing Machines*, Apr. 22-24, 2002.

Sharma, A., et al., "Accelerating FPGA Routing Using Architecture-Adaptive A* Techniques," *Proceedings of the IEEE Conference on Field-Programmable Technology 2005*, Dec. 11-14, 2005.

Sheeran, M., "Generating Fast Multipliers Using Clever Circuits," Lecture Notes in Computer Science, Springer Berlin/Heidelberg, 2004 Month N/A, 15 pages.

Singh, A., et al., "Interconnect Pipelining in a Throughput-Intensive FPGA Architecture," *FPGA 2001*, Feb. 11-13, 2001, pp. 153-160, ACM, Monterey, CA, USA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Slade, A.L., et al., "Reconfigurable Computing Application Frameworks," *11th Annual IEEE Symposium on Field-Programmable Custom Computer Machines*, Apr. 9-11, 2003.

Snider, G., "Performance-Constrained Pipelining of Software Loops onto Reconfigurable Hardware," *FPGA '02*, Feb. 24-26, 2002, pp. 177-186, ACM, Monterey, California, USA.

Tau, E., et al., "A First Generation DPGA Implementation," *Proceedings of the Third Canadian Workshop on Field-Programmable Devices*, May 1995, pp. 138-143.

Tau, E., et al., "Transit Note #114: A First Generation DPGA Implementation," *M.I.T. Transit Project*, Jan. 1995, pp. 1-8.

Teifel, J., et al., "Highly Pipelined Asynchronous FPGAs," *Proceedings of the 2004 ACM/SIGDA 12th International Symposium on Field Programmable Gate Arrays*, Feb. 22-24, 2004, Monterey, California, USA.

Tessier, R., et al., "Balancing Logic Utilization and Area Efficiency in FPGAs," *Proceedings of the Roadmap to Reconfigurable Computing, 10th International Workshop on Field Programmable Logic and Applications*, Aug. 27-30, 2000, pp. 535-544.

Tom, M., et al., "Clustering of Large Designs for Channel-Width Constrained FPGAs," *University of British Columbia, Department of Electrical and Computer Engineering*, Jun. 2005, slides 1-39, Vancouver, British Columbia, Canada.

Tom, M., et al., "Logic Block Clustering of Large Designs for Channel-Width Constrained FPGAs" *DAC 2005*, Jun. 13-17, 2005, pp. 726-731, ACM, Anaheim, California, USA.

Trimberger, S., "Effects of FPGA Architecture on FPGA Routing," *32nd ACM/IEEE Design Automation Conference*, Jun. 1995, ACM.

Tsu, W., et al., "HSRA: High-Speed, Hierarchical Synchronous Reconfigurable Array," *Proceedings of the International Symposium on Field Programmable Gate Arrays*, Feb. 1999, pp. 69-78.

Wawrzynek, J., "EECS150-Digital Design: Lecture 5—Field Programmable Gate Arrays (FPGAs)," Feb. 4, 2002, slides 1-20, multiple slides per page.

Weaver, N., et al., "The SFRA: A Corner-Turn FPGA Architecture," *FPGA '04*, Feb. 22-24, 2004, ACM, Monterey, California, USA.

Wilton, S.J.E., "Memory-to-Memory Connection Structures in FPGAs with Embedded Memory Arrays," *FPGA 97*, Feb. 1997, pp. 10-16, ACM, Monterey, California, USA.

Xilinx, Inc., "Virtex-4 Family Overview," *Advance Product Specification*, Sep. 10, 2004, pp. 21-30, v1.1, Xilinx, Inc.

Xing, S., et al., "FPGA Adders: Performance Evaluation and Optimal Design," *IEEE Design & Test of Computers*, Jan.-Mar. 1998, pp. 24-29, IEEE.

Zilic, Z. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, California, USA.

Zuchowski, P.S., "A Hybrid ASIC and FPGA Architecture," *Proceedings of the 2002 IEEE/ACM International Conference on Computer-Aided Design*, Nov. 10-14, 2002, pp. 187-194, San Jose, California, USA.

\* cited by examiner

CONFIGURABLE INTEGRATED CIRCUIT WITH BUILT-IN TURNS

CLAIM OF BENEFIT TO PRIOR APPLICATIONS

This Application is a continuation application of U.S. patent application Ser. No. 12/773,012, filed May 3, 2010, now issued as U.S. Pat. No. 7,994,817. U.S. patent application Ser. No. 12/773,012 is a continuation application of U.S. patent application Ser. No. 11/945,221, filed Nov. 26, 2007, now issued as U.S. Pat. No. 7,737,722. U.S. patent application Ser. No. 11/945,221 is a continuation application of U.S. patent application Ser. No. 10/882,945, filed Jun. 30, 2004, now issued as U.S. Pat. No. 7,312,630. U.S. Pat. Nos. 7,994,817, 7,737,722 and 7,312,630 are incorporated herein by reference.

FIELD OF THE INVENTION

The present invention is directed towards configurable integrated circuit with built-in turns.

BACKGROUND OF THE INVENTION

The use of configurable integrated circuits ("IC's") has dramatically increased in recent years. One example of a configurable IC is a field programmable gate array ("FPGA"). An FPGA is a field programmable IC that has an internal array of logic circuits (also called logic blocks) that are connected together through numerous interconnect circuits (also called interconnects). In an FPGA, the internal array of logic and interconnect circuits is typically surrounded by input/output blocks. Like some other configurable IC's, the logic and interconnect circuits of an FPGA are configurable.

FIG. 1 illustrates an array structure 100 of a prior art FPGA. As shown in this figure, the array 100 includes numerous logic circuits 105 and interconnect circuits 110. In this architecture, the logic circuit 105 are referred to configurable logic blocks (CLB's). Each CLB is formed by several configurable look-up tables (LUT's), where each LUT is a configurable logic circuit.

As shown in FIG. 1, the FPGA array structure 100 has two types of interconnect circuits 110a and 110b. Interconnect circuits 110a are connection boxes that connect CLB's 105 and interconnect circuit 110b to other CLB's 105 and interconnect circuits 110b. Interconnect circuits 110b, on the other hand, are switchboxes that connect the connection boxes 110a to other connection boxes 110a.

Although not explicitly illustrated in FIG. 1, a CLB 105 can connect to CLB's that are several columns or several rows away from it in the array. FIG. 2 illustrates several such connections in a prior configurable node architecture. Specifically, this figure illustrates an array 205 of CLB's 210 without showing any of the intervening switch and connection boxes. As shown in this figure, a CLB 210a connects to CLB's that are one, two, three and six rows above and below it, and to CLB's that are one, two, three, and six columns to its right and left.

The advantage of the connection architecture illustrated in FIG. 2 is that it allows one CLB to connect to another CLB that is much farther away where the distance is measured in terms of connection between two CLB's. On the other hand, this architecture requires the use of multiple connections to connect two CLB's that are in two different rows and columns. This requirement makes the connection architecture illustrated in FIG. 2 inefficient and expensive as each connection requires the use of transistor switching logic.

Also, the connection architecture illustrated in FIG. 2 is not designed to optimize the number of CLB's reachable from any given CLB. Specifically, this architecture employs the same connection scheme for each CLB. Hence, as shown in FIG. 3, this architecture can result in a cycle between two CLB's 305 and 310 in the same column, or two CLB's 315 and 320 in the same row. Such cycles are undesirable as they come at the expense of reachability of other CLB's. The uniform connection architecture of FIG. 2 is also inefficient as it provides more ways than necessary for reaching one CLB from another CLB. This redundancy is illustrated in FIG. 3, which illustrates that the CLB 325 can connect to CLB 330 through two different sets of connections, one that goes through CLB 335 and one that goes through CLB 340. This redundancy is undesirable as it comes at the expense of reachability of other CLB's.

There is a need in the art for a configurable IC that has a wiring architecture that increases the interconnectivity between its configurable nodes. Ideally, this wiring architecture is optimized for the interconnectivity between the configurable nodes of the configurable IC. There is also a need for a method that identifies optimal connection schemes for connecting the configurable nodes of a configurable IC.

SUMMARY OF THE INVENTION

Some embodiments of the invention provide configurable integrated circuits ("IC's") with configurable node arrays. In some embodiments, the configurable node array includes numerous (e.g., 50, 100, etc.) configurable nodes arranged in several rows and columns. This array also includes several direct offset connections, where each particular direct offset connection connects two nodes that are neither in the same column nor in the same row in the array. In some embodiments, at least some direct offset connections connect pairs of nodes that are separated in the array by more than one row and at least one column, or by more than one column and at least one row.

Some embodiments establish a direct connection by (1) a set of wire segments that traverse through a set of the IC's wiring layers, and (2) a set of vias when two or more wiring layers are involved. In some embodiments, some of the direct connections have intervening circuits (e.g., buffer circuits), while other direct connections do not have any intervening circuits. Also, in some embodiments, the nodes in the configurable array are all similar (e.g., have the same set of circuit elements and same internal wiring between the circuit elements).

Some embodiments provide an IC with a configurable node array that has (1) two similar nodes within the interior of the array, and (2) two different connection schemes. The first connection scheme specifies a set of connections between the first node and a set of nodes in the array, while the second connection scheme specifies a second set of connections between the second node and a set of nodes in the array. The two nodes cannot connect to any nodes on the boundary of the array with any connection that is specified in any connection scheme.

Some embodiments provide a method that defines a set of connections that connect the nodes in a configurable node array. The method identifies different sets of connections for connecting a set of the nodes. For each identified set of connections, the method computes a metric score that quantifies a quality of the identified set of connections. The method then selects one of the identified sets of connections to connect the configurable nodes in the array.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

I. Definitions

Figure 4:
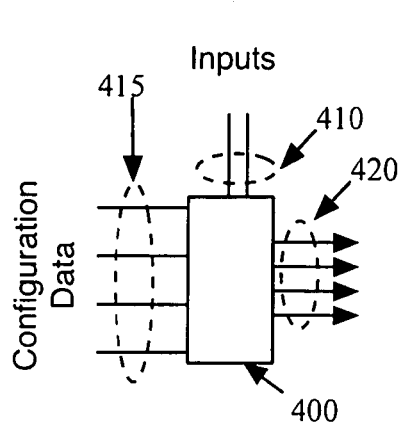
FIG. 4 illustrates an example of a configurable logic circuit that can perform a set of functions.

A logic circuit is a circuit that can perform a function on a set of input data that it receives. A configurable logic circuit is a logic circuit that can be configured to perform different functions on its input data set. FIG. 4 illustrates an example of a configurable logic circuit 400 that can perform a set of functions. As shown in this figure, the logic circuit 400 receives a set of input data 410 and a set of configuration data 415, and provides a set of output data 420. The configuration data determines the function that the logic circuit performs on its input data. In other words, the configuration data 415 causes the logic circuit to perform a particular function within its set of functions on the input data set 410. Once the logic circuit performs a function on its input data set, the logic circuit 400 provides the result of this function as its output data set 420. The logic circuit 400 is said to be configurable, as the configuration data set "configures" the logic circuit to perform a particular function. Other examples of configurable logic circuits can be found in U.S. Pat. No. 7,157,933 issued on Jan. 2, 2007, entitled "Configurable Circuits, IC's, and Systems". U.S. Pat. No. 7,157,933 is incorporated in the present application by reference.

Figure 5:
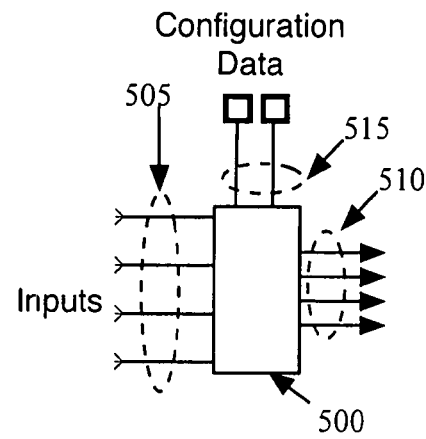
FIG. 5 illustrates an example of a configurable interconnect circuit.

A configurable interconnect circuit is a circuit that can configurably connect an input set to an output set in a variety of manners. FIG. 5 illustrates an example of a configurable interconnect circuit 500. This interconnect circuit 500 connects a set of input terminals 505 to a set of output terminals 510, based on a set of configuration data 515 that the interconnect circuit receives. In other words, the configuration data specify how the interconnect circuit should connect the input terminal set 505 to the output terminal set 510. The interconnect circuit 500 is said to be configurable, as the configuration data set "configures" the interconnect circuit to use a particular connection scheme that connects the input terminal set to the output terminal set in a desired manner. Other examples of configurable interconnect circuits can be found in the above-incorporated application.

Figure 6:
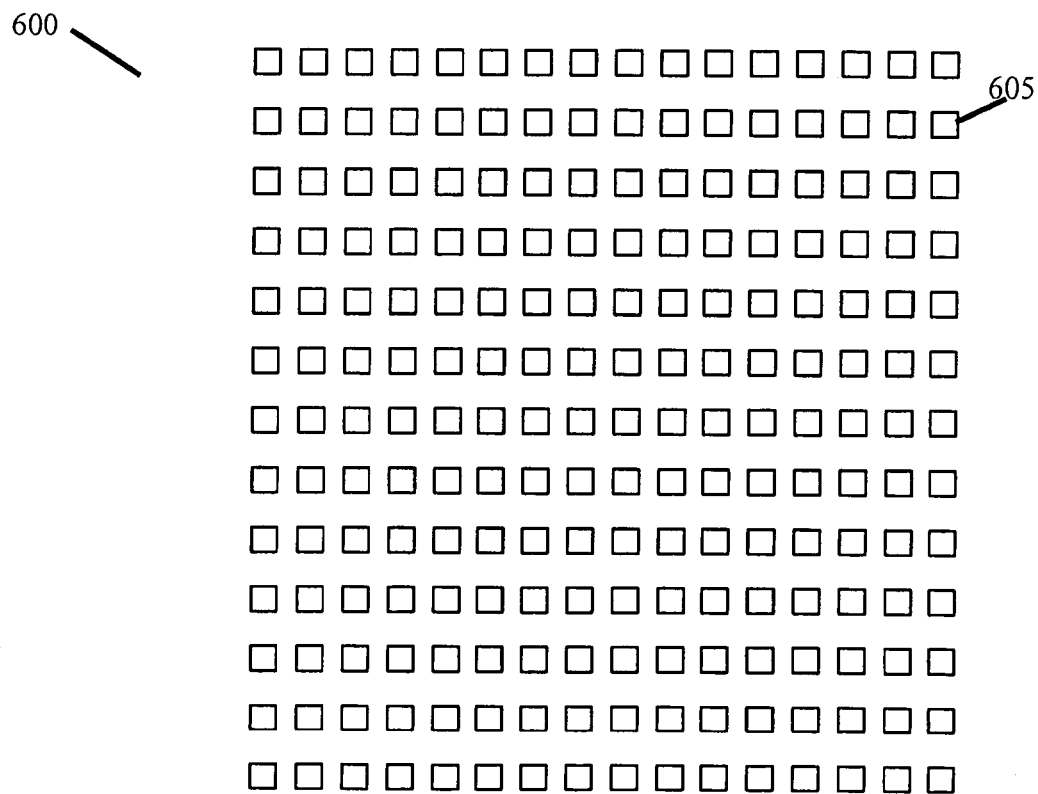
FIG. 6 illustrates an example of a configurable node array.

A configurable node array is an array with numerous configurable nodes that are arranged in several rows and columns. FIG. 6 illustrates an example of a configurable node array 600 that includes 208 configurable nodes 605 that are arranged in 13 rows and 16 columns. Each configurable node in a configurable node array is a configurable circuit that includes one or more configurable sub-circuits.

Figure 7:
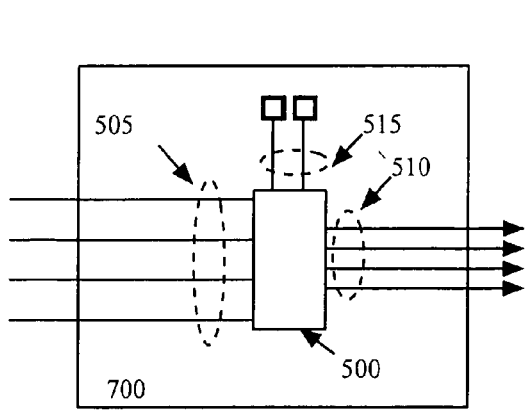
FIGS. 7-10 illustrate several examples of configurable nodes in a configurable node array.
Figure 8:
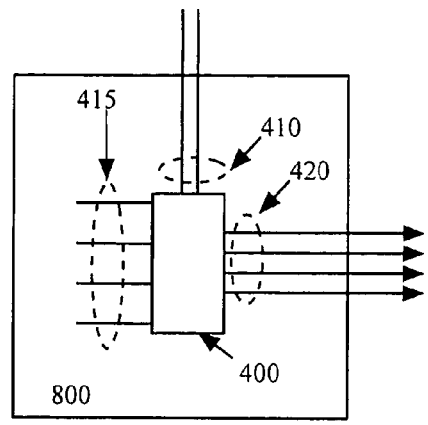

FIGS. 7-10 illustrate several examples of configurable nodes in an array. Specifically, FIG. 7 illustrates a configurable node 700 that is a configurable interconnect circuit 500. Such an interconnect circuit can be any of the interconnect circuits disclosed in the above-incorporated application, or any switchbox, connection box, switching or routing matrix, full- or partial-cross bar, etc. Alternatively, as shown in FIG. 8, a configurable node 800 can be a simple configurable logic circuit 400. Such logic circuits can be any lookup table (LUT), universal logic module (ULM), sub-ULM, multiplexer, PAL/PLA, etc., or any logic circuit disclosed in the above-incorporated application.

Figure 9:
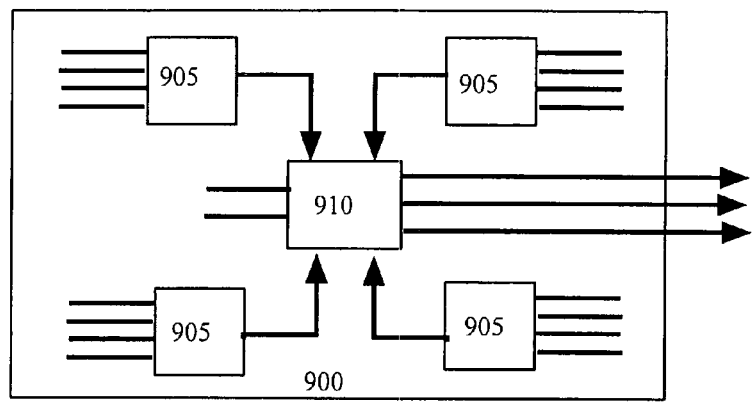

FIG. 9 illustrates yet another configurable node. This node is a complex logic circuit 900. This logic circuit is formed by multiple logic circuits (e.g., multiple LUT's) 905 and an interconnect circuit 910. One example of such a complex logic circuit is a CLB. One of ordinary skill will realize that the illustration of the logic circuit 900 is a simplification that does not show other circuit elements (e.g., fast-carry logic, etc.) that might be used in complex logic circuits. This illustration is provided only to convey the principle that more complex logic circuits are often formed by combining simpler logic circuits and interconnect circuits. Examples of simple and complex logic circuits can be found Architecture and CAD for Deep-Submicron FPGAs, Betz, et al., ISBN 0792384601, 1999. Other examples of logic circuits are provided in the above-incorporated application.

Figure 10:
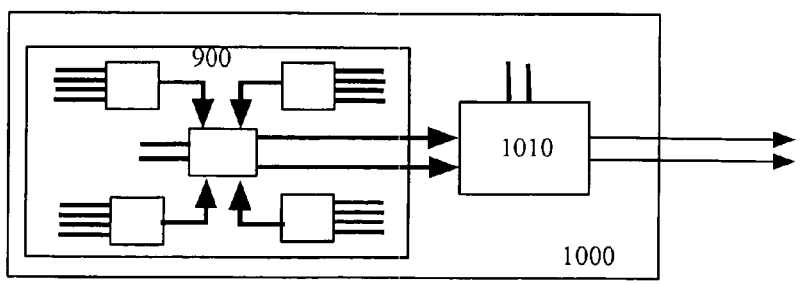

FIG. 10 illustrates still another configurable node. This node 1000 is formed by a combination of a complex logic circuit (in this example, the complex logic circuit 900) and a complex interconnect circuit 1010 (e.g., a switchbox or connection box).

In some embodiments, some or all configurable nodes in the array have the same or similar circuit structure. For instance, in some embodiments, some or all the nodes have the exact same circuit elements (e.g., have the same set of logic gates and blocks and/or same interconnect circuits), where one or more of these identical elements are configurable elements. One such example would be a set of nodes in the array that are each formed by a particular set of LUT's and interconnects. Having nodes with the same circuit elements simplifies the process for designing and fabricating the IC, as it allows the same circuit designs and mask patterns to be repetitively used to design and fabricate the IC.

In some embodiments, the similar configurable nodes not only have the same circuit elements but also have the same exact internal wiring between their circuit elements. For instance, in some embodiments, a particular set of LUT's and interconnects that are wired in a particular manner forms each node in a set of nodes in the array. Having such nodes further simplifies the design and fabrication processes as it further simplifies the design and mask making processes.

In some embodiments, each configurable node in a configurable node array is a simple or complex configurable logic circuit. In some embodiments, each configurable node in a configurable node array is a configurable interconnect circuit. In such an array, a configurable node (i.e., a configurable interconnect circuit) can connect to one or more logic circuits. In turn, such logic circuits in some embodiments might be arranged in terms of another configurable logic-circuit array that is interspersed among the configurable interconnect-circuit array.

Several figures below illustrate several "direct connections" between nodes in an array. A direct connection is an electrical connection between two nodes that is achieved by (1) a set of wire segments that traverse through a set of the wiring layers of the IC, and (2) a set of vias when two or more wiring layers are involved.

In some embodiments, a direct connection might also include a set of buffer circuits in some cases. In other words, two nodes are directly connected in some embodiments by a set of wire segments that possibly traverse through a set of buffer circuits and a set of vias. Buffer circuits are not logic or interconnect circuits. In some embodiments, buffer circuits are part of some or all direct connections. Buffer circuits might be used to achieve one or more objectives (e.g., maintain the signal strength, reduce noise, delay signal, etc.) along the wire segments that establish the direct connections. Inverting buffer circuits also allow an IC design to reconfigure logic circuits less frequently and/or use fewer types of logic circuits. In some embodiments, buffer circuits are formed by one or more inverters (e.g., two or more inverters that are connected in series).

Figure 11:
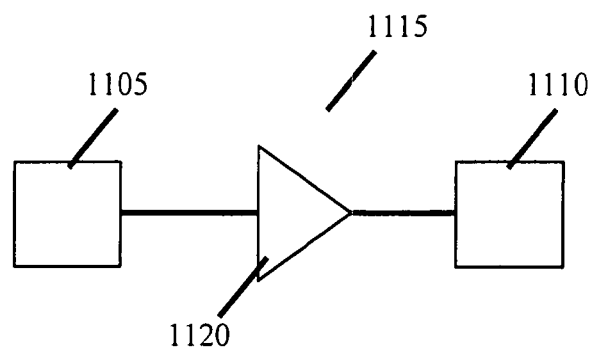
FIGS. 11 and 12 illustrate examples of two direct connections with intervening buffer circuits.
Figure 12:
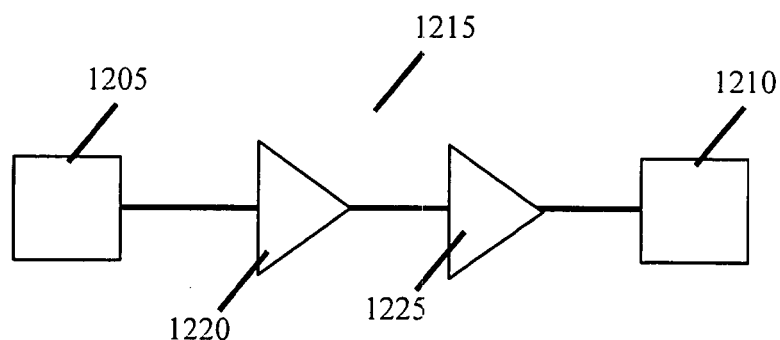

FIGS. 11 and 12 illustrate examples of two direct connections with intervening buffer circuits. Specifically, FIG. 11 illustrates an example of a direct connection 1115 between two nodes 1105 and 1110. As shown in this figure, this direct connection has an intervening buffer circuit 1120. In some embodiments, the buffer circuit 1120 is a inverter. Accordingly, in these embodiments, the direct connection 1115 inverts a signal supplied by one of the nodes 1105 or 1110 to the other node.

FIG. 12 illustrates an example of a direction connection 1215 between two nodes 1205 and 1210. As shown in this figure, this direct connection 1215 has two intervening buffer circuits 1220 and 1225. In some embodiments, the buffer circuits 1220 and 1225 are inverters. Hence, in these embodiments, the direct connection 1215 does not invert a signal supplied by one of the nodes 1205 or 1210 to the other node.

Several figures below "topologically" illustrate several direct connections between nodes in an array. A topological illustration is an illustration that is only meant to show a direct connection between two nodes without specifying a particular geometric layout for the wire segments that establish the direct connection.

II. Direct Connections Between Offset Nodes

Figure 13:
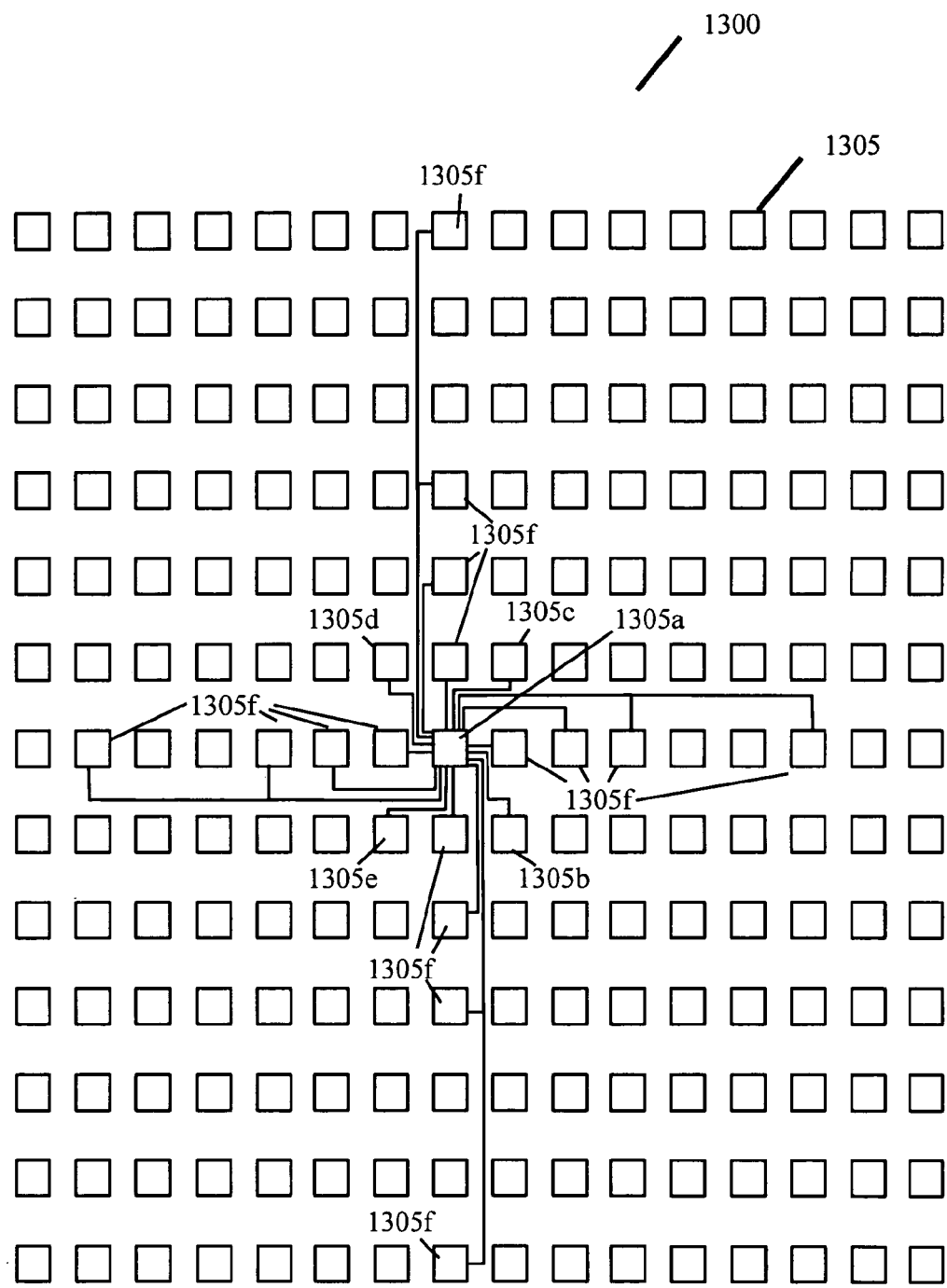
FIG. 13 presents topologic illustrations of several direct connections in a configurable node array of some embodiments of the invention.

FIG. 13 illustrates a configurable node array 1300 of some embodiments of the invention. This array is a part of a configurable IC that has multiple wiring layers. This array includes numerous configurable nodes 1305 that are arranged in numerous rows and columns. In some embodiments, this array has numerous (hundreds, thousands, millions, etc.) of configurable nodes that are arranged in numerous (e.g., tens, hundreds, thousands, etc. of) rows and columns.

FIG. 13 provides a topological illustration of several direct connections between a configurable node 1305a and several other nodes in the array 1300. As shown in this figure, the configurable node 1305a has direct connections with several nodes 1305f that are horizontally/vertically aligned with it in the array. In addition, the configurable node 1305a has direct connections with nodes 1305b, 1305c, 1305d, and 1305e that are not horizontally/vertically aligned with node 1305a. As shown in FIG. 13, nodes 1305b, 1305c, 1305d, and 1305e are one row and one column away from the node 1305a.

Figure 14A:
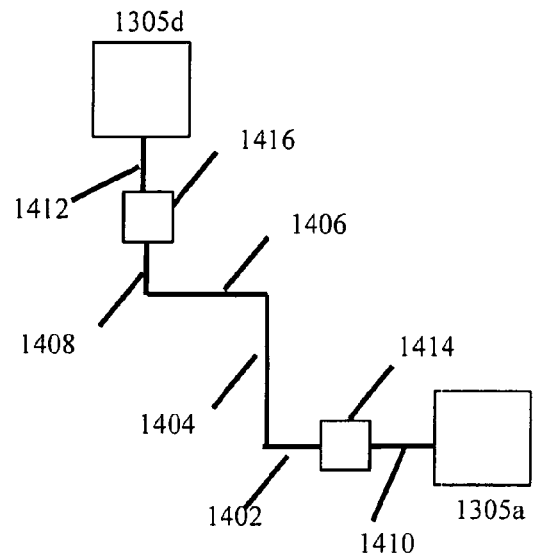
FIGS. 14A-14C illustrate examples of different geometric realizations for some of the direct connections topologically illustrated in FIG. 11.
Figure 14B:
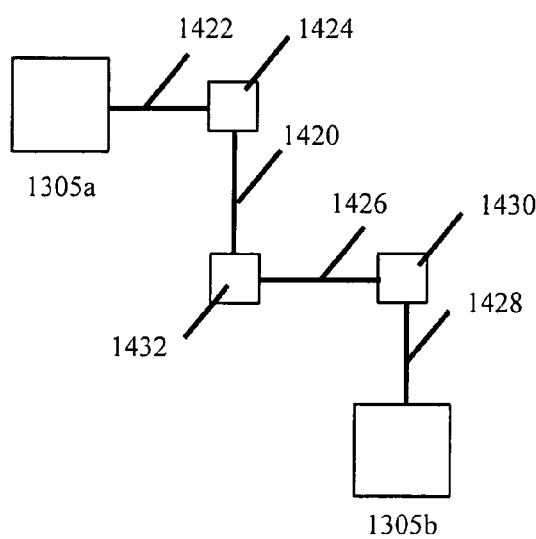

As mentioned above, the illustrations of the direct connections in FIG. 13 are only topological illustrations. Each of these direct connections can be achieved by a variety of geometric realizations. In some instances, the set of wire segments that establish a direct connection are all on the same layer. For example, as shown in FIG. 14A, four wire segments 1402, 1404, 1406, and 1408 can establish the direct connection between nodes 1305a and 1305d. These four segments might be on a layer (e.g., the second wiring layer) that is different from the layer (e.g., the first wiring layer) that has the input/output terminals 1410 and 1412 of nodes 1305a and 1305d. Hence, in these cases, the direct connection between nodes 1305a and 1305d also require a set of vias 1414 and 1416 to connect the wire segments 1402 and 1408 to the terminals 1410 and 1412.

In other instances, the set of wire segments that establish a direct connection between two nodes are on several wiring layers. For example, in some cases, the direct connection between nodes 1305a and 1305b has a geometric realization that is similar to the representation illustrated in FIG. 13. FIG.

14B illustrates an example of this geometric realization. As shown in this figure, a geometric realization can be established by two wire segments on two different wiring layers, which are: (1) a vertical segment 1420 (on layer 2) that connects to horizontal terminal 1422 (on layer 1) of the node 1305a through a via connection 1424, and (2) a horizontal segment 1426 (on layer 3) that connects to vertical terminal 1428 (on layer 1) of the node 1305b through a stacked via connection 1430 and connects to the vertical segment 1420 through a via connection 1432.

Figure 14C:
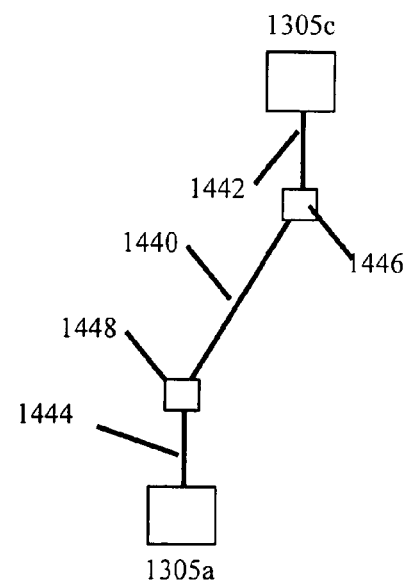

When the IC uses a wiring model that allows occasional or systematic diagonal wiring, a direct connection between two nodes can be established by one or more diagonal wire segments possibly in conjunction with one or more Manhattan (i.e., horizontal or vertical) segments. For the direct connection between nodes 1305a and 1305c, FIG. 14C illustrates an example of a geometric realization that is achieved by using a diagonal segment 1440. This diagonal segment is in the 60°-direction on a third wiring layer, which has the 60°-direction as its preferred wiring direction. This segment connects to the vertical terminal 1442 (on layer 1) of node 1305c and the vertical terminal 1444 (on layer 1) of node 1305a through stacked via connections 1446 and 1448.

Some embodiments allow "long-offset" direct connections between two nodes in the array. A "long-offset" connection is a direct connection between two nodes in the array that are offset by more than one row and at least one column, or more than one column and at least one row. As mentioned above, a direct connection might include one or more buffer circuits that are connected to the wire segments of the direct connection. In some embodiments, such buffer circuits are more likely to be used for longer connections than for the shorter connections, as signal strength is a more pressing issue for longer connections.

Figure 15:
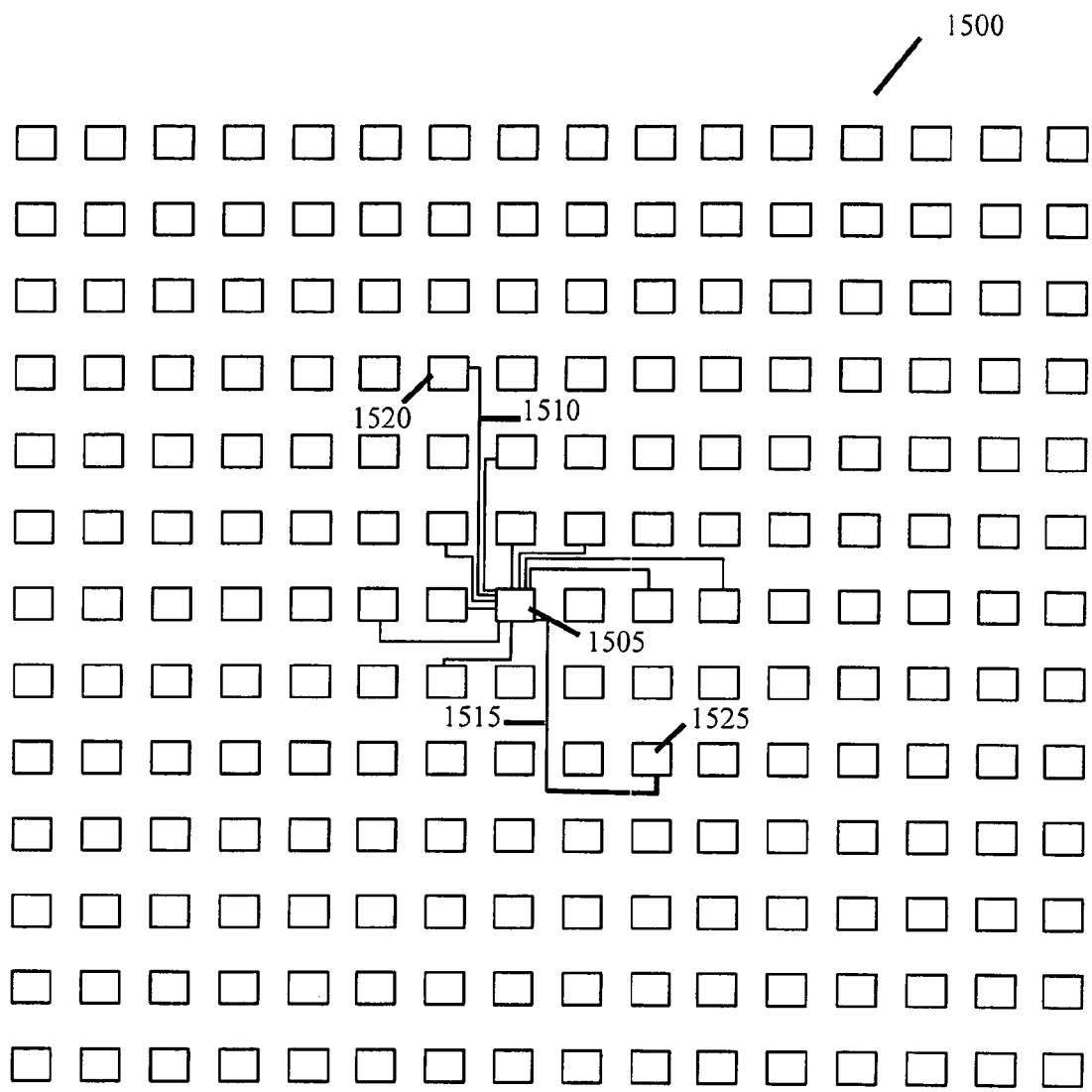
FIG. 15 illustrates an example of two long-offset direct connections.

FIG. 15 illustrates an example of two long-offset direct connections. This figure illustrates a configurable node array 1500 that has a configurable node 1505. This configurable node 1505 has two long-offset direct connections 1510 and 1515, which are topologically illustrated in FIG. 15. The first direct connection 1510 connects node 1505 to node 1520, which is above node 1505 by three rows and is to the left of the node 1505 by one column. The second direct connection 1515 connects node 1505 to node 1525, which is below node 1505 by two rows and is to the right of the node 1505 by two columns.

Table 1 below identifies the direct connections of node 1505. This table identifies a direct connection between node 1505 and one of its neighboring nodes in terms of two coordinates. These two coordinates are a delta-column coordinate and a delta-row coordinate, which specify the column and row offset between the particular node and the connected neighboring node.

TABLE 1

Direct Connections of Node 1505

| Delta-Column | Delta-Row |
|---|---|
| 2 | 0 |
| 3 | 0 |
| 1 | 1 |
| 0 | 1 |
| 0 | 2 |
| -1 | 1 |
| -1 | 3 |
| -1 | 0 |
| -2 | 0 |

TABLE 1-continued

Direct Connections of Node 1505

| Delta-Column | Delta-Row |
|---|---|
| -1 | -1 |
| 2 | -2 |

III. Different Direct-Connection Schemes

Figure 16:
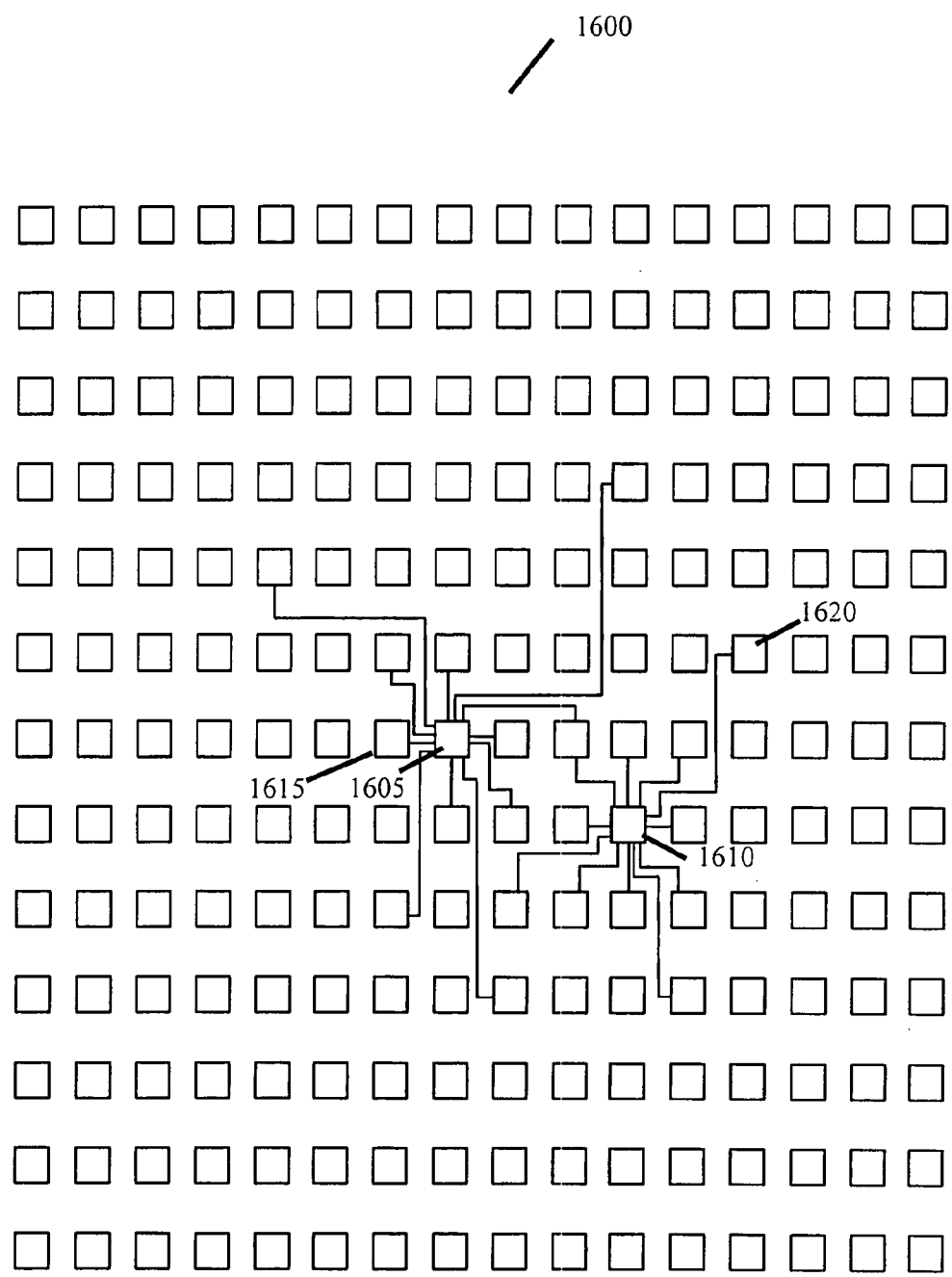
FIG. 16 illustrates a configurable node array that use two different direct-connection schemes for two similar nodes in a configurable node array.

Some embodiments of the invention use several different direct connection schemes for same types of nodes in a configurable node array. FIG. 16 illustrates one such embodiment. Specifically, this figure illustrates a configurable node array 1600 that use two different direct-connection schemes for two nodes 1605 and 1610 in the array.

The nodes 1605 and 1610 are of the same type. In some embodiments, two nodes are of the same type when they have the same circuit elements with one or more of these identical elements being configurable. In some embodiments, two nodes of the same type also have the same internal wiring between their identical circuit elements. For instance, in some embodiments, the nodes 1605 and 1610 are two switchboxes that have the same component circuit elements and interconnect wiring between the circuit elements.

Tables 2 and 3 below respectively identify the direct connections of nodes 1605 and 1610. Like Table 1, each of these tables identifies a direct connection between a particular node and one of its neighboring nodes in terms of two coordinates, a delta-column coordinate and a delta-row coordinate. For instance, the third record in Table 2 specifies a delta-column coordinate of −1 and a delta-row coordinate of 0. This record specifies a direct connection between node 1605 and the node 1615 directly to the left of it. Alternatively, the fifth record in Table 3 specifies a delta-column coordinate of 2 and a delta-row coordinate of 2. This record specifies a direct connection between node 1610 and the node 1620, which is two rows above and two columns to the right of node 1610.

TABLE 2

Direct Connections of Node 1605

| Delta-Column | Delta-Row |
|---|---|
| 1 | 0 |
| 0 | 1 |
| -1 | 0 |
| 0 | -1 |
| 2 | 0 |
| 3 | 3 |
| -3 | 2 |
| -1 | 1 |
| -1 | -2 |
| 1 | -3 |
| 1 | -1 |

TABLE 3

Direct Connections of Node 1610

| Delta-Column | Delta-Row |
|---|---|
| 1 | 0 |
| 0 | 1 |
| -1 | 0 |
| 0 | -1 |
| 2 | 2 |
| 1 | 1 |
| -1 | 1 |
| -2 | -1 |

TABLE 3-continued

Direct Connections of Node 1610

| Delta-Column | Delta-Row |
|---|---|
| −1 | −1 |
| 1 | −2 |
| 1 | −1 |

Figure 17:
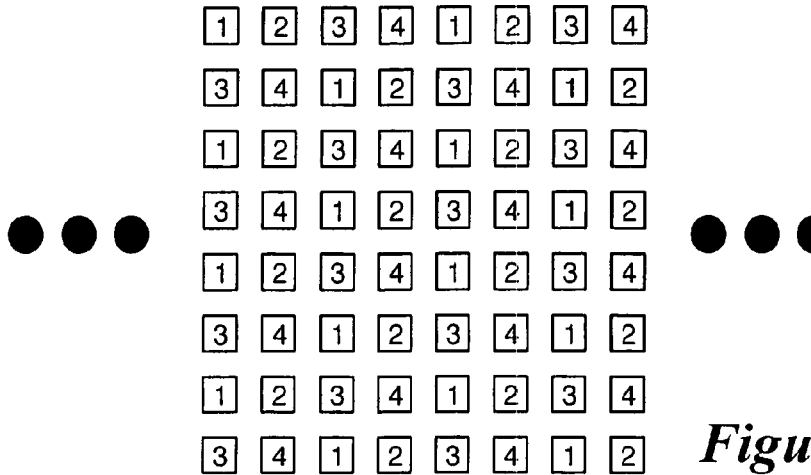
FIG. 17 illustrates a portion of a configurable node array that has four different direct-connection schemes.

Some embodiments of the invention use several different direct connection schemes for similar node types in a configurable node array. One such embodiment is illustrated in FIG. 17. This figure illustrates a portion of a configurable node array 1700 that has four different direct-connection schemes. Specifically, each node in this array has one of four direct connection schemes, as illustrated by the labels 1, 2, 3, and 4 in FIG. 17.

FIGS. 18-21 provide topological illustrations of four direct connection schemes that can be used as the four schemes illustrated in FIG. 17. Table 4 below identifies the four direct connection schemes illustrated in FIGS. 18-21. This table identifies each connection scheme in terms of eight vectors, where each vector is specified as a pair of delta-column and delta-row coordinates. For instance, the eighth column, third row of Table 4 identifies the seventh direct-connection vector of the second connection scheme as a vector with the coordinates −1,2. This vector specifies a direct connection between a node 1905 and a node 1910 that is one column to the left of and two rows above the node 1905.

TABLE 4

Direct Connection Schemes 1800-2100

| Connection Scheme | 1$^{st}$ Vector | 2$^{nd}$ Vector | 3$^{rd}$ Vector | 4$^{th}$ Vector | 5$^{th}$ Vector | 6$^{th}$ Vector | 7$^{th}$ Vector | 8$^{th}$ Vector |
|---|---|---|---|---|---|---|---|---|
| 1 (1800) | 1, 0 | 0, 1 | −1, 0 | 0, −1 | 1, 1 | −3, 0 | 2, 1 | 8, 8 |
| 2 (1900) | 0, 1 | −1, 0 | 0, −1 | 1, 0 | −1, 1 | 0, −3 | −1, 2 | −8, 8 |
| 3 (2000) | −1, 0 | 0, −1 | 1, 0 | 0, 1 | 1, −1 | −3, 0 | 2, −1 | 8, −8 |
| 4 (2100) | 0, −1 | 1, 0 | 0, 1 | −1, 0 | −1, −1 | 0, 3 | −1, −2 | −8, −8 |

As indicated in Table 4, each of the four connection schemes illustrated in FIGS. 18-21 has direct connections with its four closest horizontally and vertically aligned neighbors. Each of these connection schemes also has four long-offset direct connections. These connections are identified as the fifth, sixth, seventh, and eighth vectors in Table 4.

As apparent from the numerical values of the vectors specified in Table 4, the connection schemes illustrated in FIGS. 18-21 have a symmetrical relationship with respect to each other. According to this symmetrical relationship, each vector (a, b) in the first connection scheme (illustrated in FIG. 18) has a corresponding symmetrically related vector in each of the other three connection schemes. These symmetrically related vectors in the second, third, and fourth connection schemes respectively are: (−b,a), (a,−b), and (−b,−a). For example, the seventh vector (2, 1) in the first connection scheme is symmetrically related to the following vectors in the second, third, and fourth connection schemes: (−1, 2), (2, −1), and (−1, −2).

Figure 22:
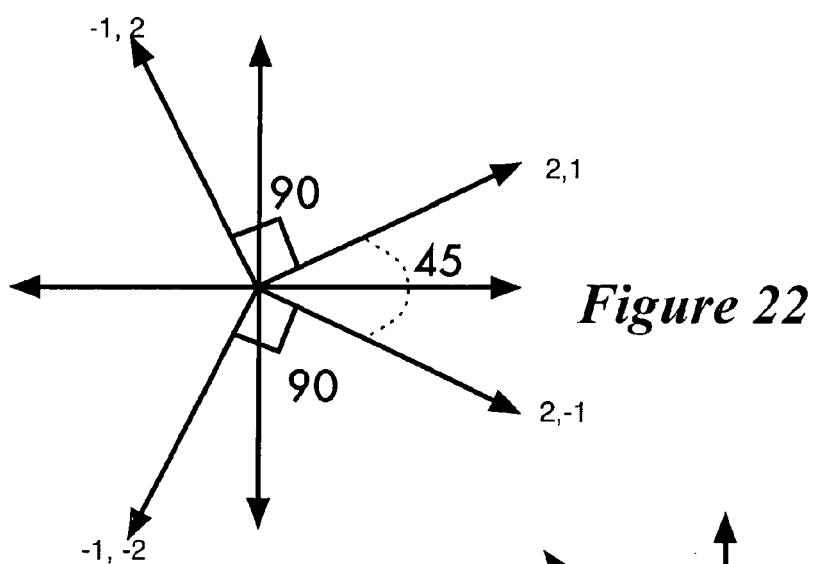
FIG. 22 pictorially illustrates the symmetrical relationship between the four connection schemes illustrated in FIGS. 18-21.

FIG. 22 pictorially illustrates the symmetrically related seventh vectors in these four connection schemes. FIG. 22 also illustrates another way of expressing the symmetrical relationship between vectors in the four connection schemes of FIGS. 18-21. As shown in FIG. 22, (1) each vector (e.g., the 5$^{th}$ vector) in the second connection scheme 1900 is 90° rotated in the counterclockwise direction with respect to its corresponding vector (e.g., the 5$^{th}$ vector) in the first connection scheme 1800, (2) each vector in the third connection scheme 2000 is 45° rotated in the clockwise direction with respect to its corresponding vector in the first connection scheme 1800, and (3) each vector in the fourth connection scheme 2100 is 135° rotated in the clockwise direction with respect to its corresponding vector in the first connection scheme 1800.

Figure 23:
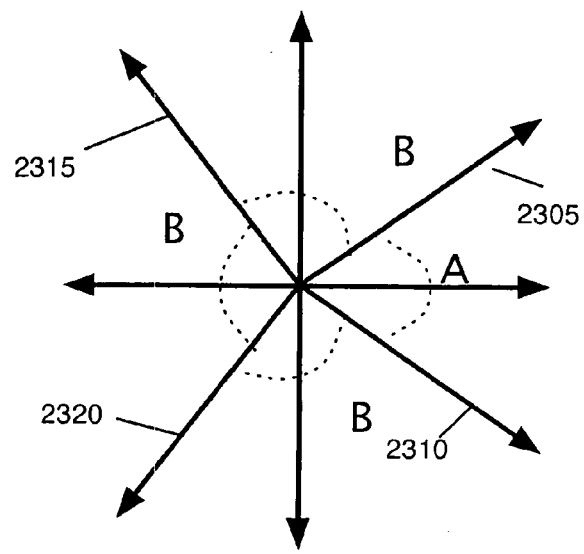
FIG. 23 pictorially illustrates another possible symmetrical relationship that can be used by four symmetrically related connection schemes.
Figure 18:
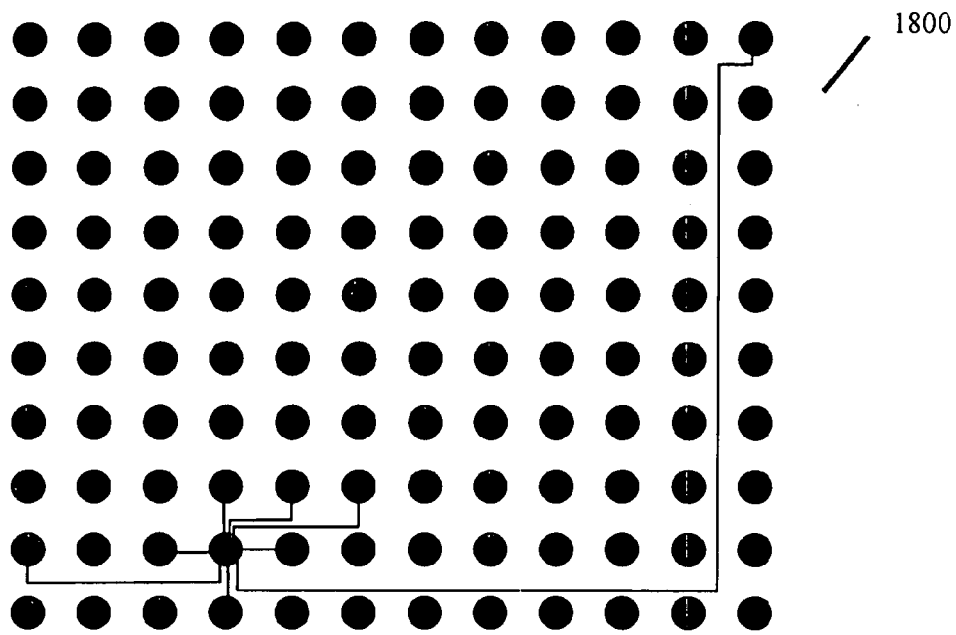
FIGS. 18-21 provide topological illustrations of four direct connection schemes that can be used as the four schemes illustrated in FIG. 17.
Figure 19:
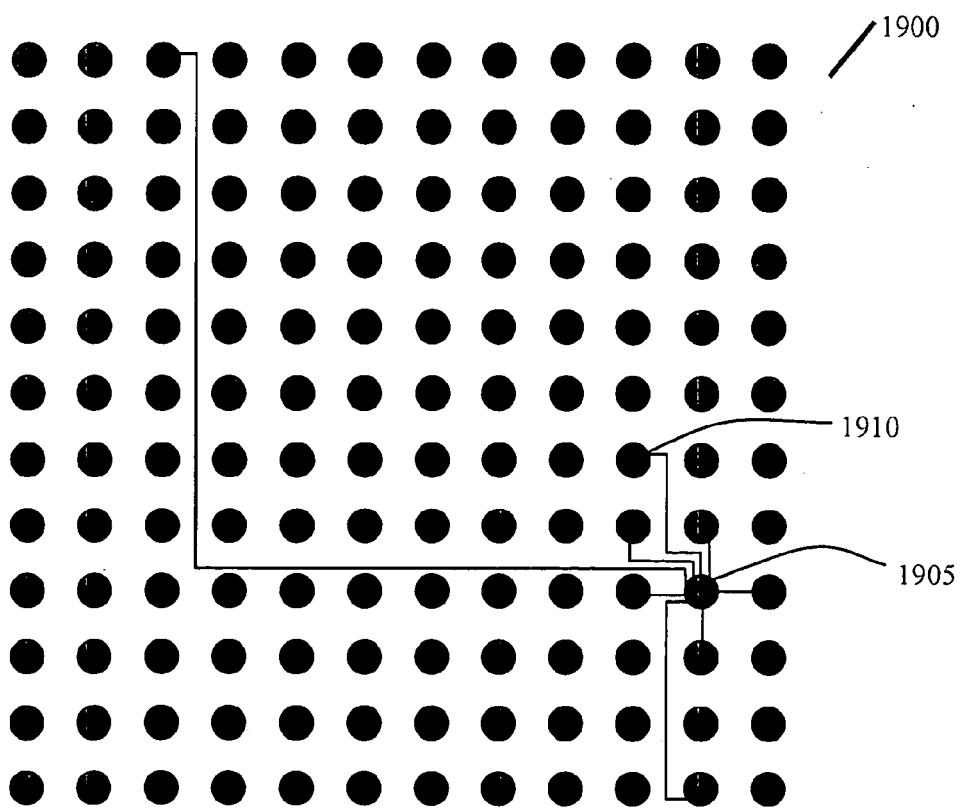
Figure 20:
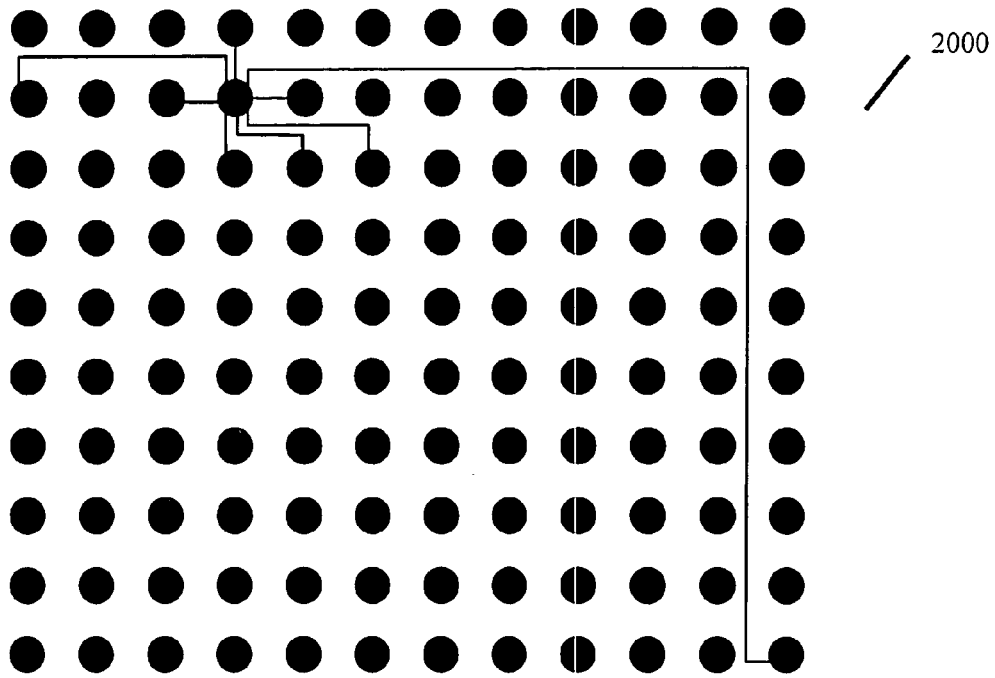
Figure 21:
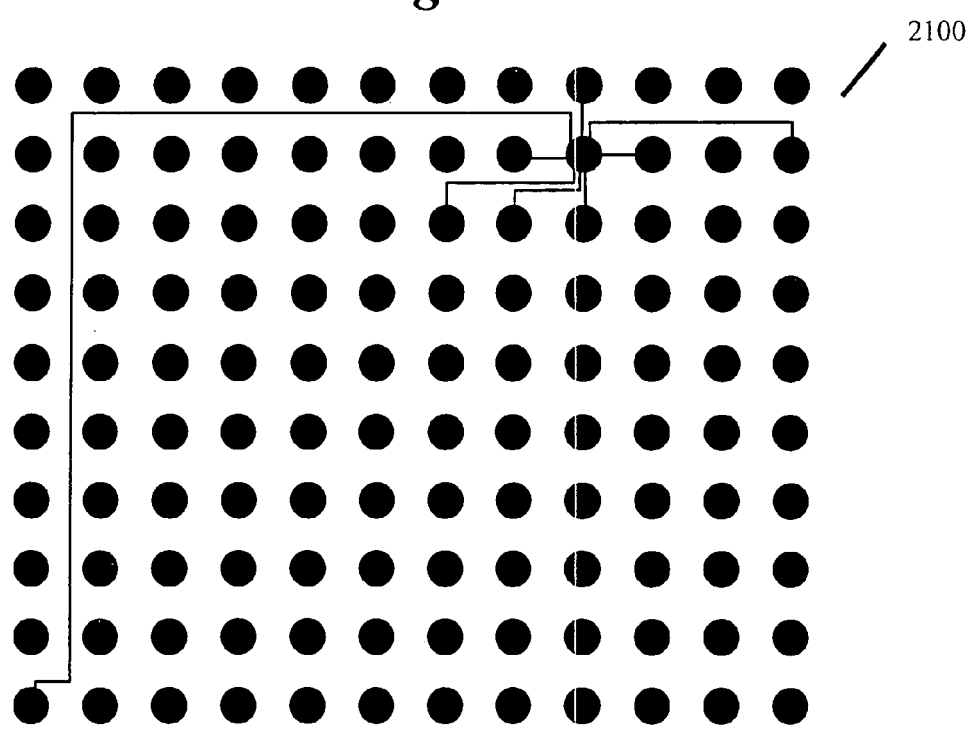

Other embodiments use other symmetrical relationships to generate other sets of symmetrical connection schemes. FIG. 23 illustrates an alternative symmetrical relationship between four connection schemes. According to this symmetrical relationship, each vector in a first connection scheme has a corresponding symmetrically related vector in each of three other connection schemes. Specifically, a vector 2305 in the first connection scheme has (1) a corresponding vector 2310 in the second connection scheme, which is identical to vector 2305 except that it has been rotated by an angle A in the clockwise direction, (2) a corresponding vector 2315 in the third connection scheme, which is identical to vector 2305 except that it has been rotated by an angle B (where B equals (360−A)/3) in the counterclockwise direction, and (3) a corresponding vector 2320 in the fourth connection scheme, which is identical to vector 2305 except that it has been rotated by an angle 2*B in the counterclockwise direction.

One of ordinary skill will realize that other embodiment might use fewer or more connection schemes for nodes of the same type in a configurable node array. For instance, some embodiments might only use two connection schemes. Also, in other embodiments, some or all of the connection schemes are not symmetrically related to the other connections schemes. In addition, some embodiments do not include unit vectors or the same set of unit vectors in each connection scheme. Furthermore, in some embodiments, the different connection schemes define different number of long-offset direct connections for the same type of configurable nodes.

IV. Process For Specifying Different Direct-Connection Schemes

Some embodiments of the invention provide a method that defines a set of connections for connecting nodes in a configurable node array, which, in some embodiments, are the same type of nodes. This method examines several different sets of connections for connecting a set of the nodes. In each of the identified sets, the method then computes a metric score that quantifies a quality of the identified set of connections in connecting the configurable nodes. The method then selects at least one of the identified sets of connections for connecting the configurable nodes in the array.

Different embodiments might use different metric scores that optimize different qualities of the connection sets. For instance, in some embodiments, the metric score might express the number of nodes reachable from a node. This metric score optimizes the overall reachability. In other embodiments, the metric score might express length constraints, reconvergence, reachability within a particular number of "hops," prioritized reachability, etc. (where a hop is a direct connection between two nodes).

Figure 24:
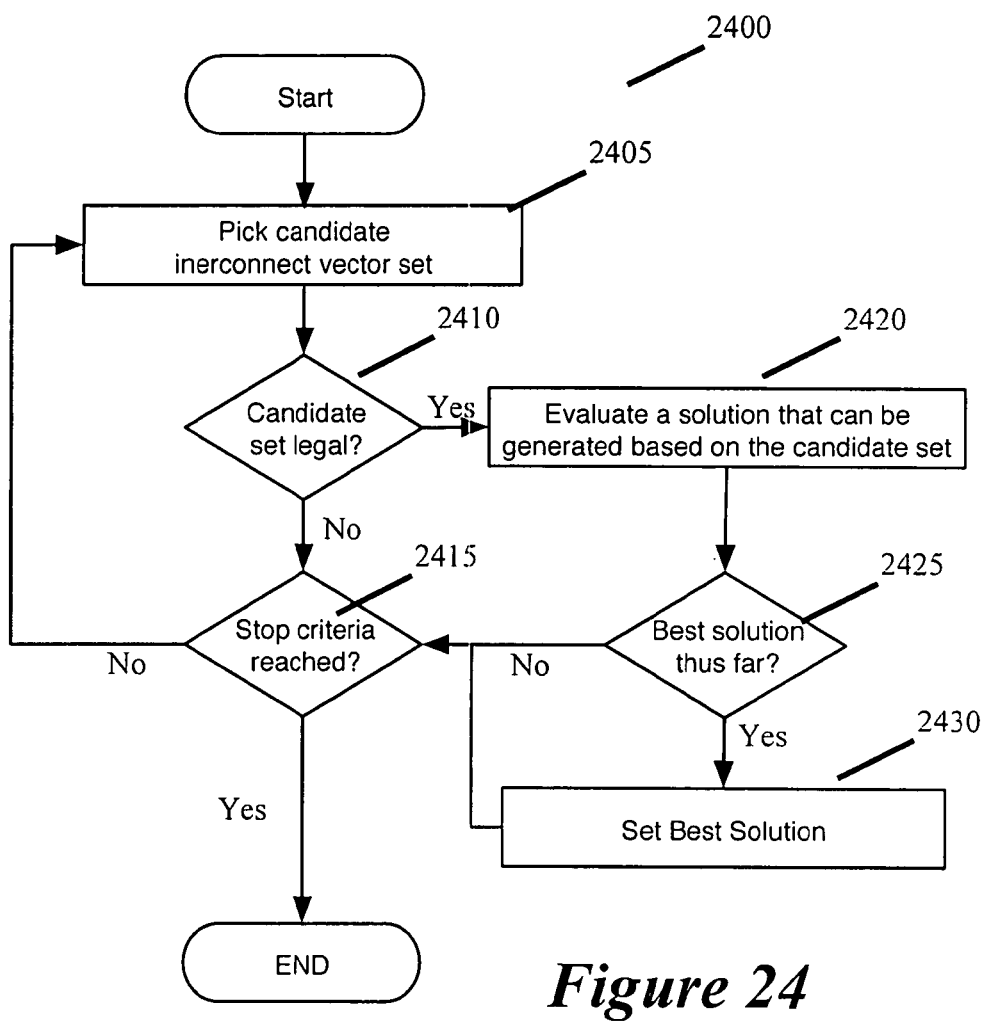
FIGS. 24 and 25 illustrate an optimization process that generates and examines different direct-connection schemes for different configurable nodes in a configurable node array.

Different embodiments use different optimization techniques to optimize the metric score that quantifies the quality of the identified set of connections. For instance, some embodiments use complex constrained optimization techniques, such as local optimization, simulated annealing, etc. Other embodiments use less complex techniques. One example of a simple constrained optimization technique is illustrated in FIG. 24. Specifically, this figure illustrates a process 2400 that randomly generates and examines different direct-connection schemes for different configurable nodes in a configurable node array. This process tries to identify a set of connection schemes that enables a maximally dispersed exploration of a node graph that corresponds to a configurable node array.

As shown in this figure, the process 2400 initially generates (at 2405) a candidate connection-vector set for a single direct-connection scheme. In some embodiments, the candidate-vector set generated at 2405 includes only the direct-connection vectors that will differ among the direct-connection schemes specified by the process 2400. For instance, the process does not generate any unit vectors at 2405 when each direct-connection scheme is to have the same set of unit vectors. In some embodiments, the process generates (at 2405) the candidate connection-vector set randomly based on a set of constraints, such as the number of vectors in the set, the maximum length for any given vector, etc.

After 2405, the process determines (at 2410) whether the candidate set generated at 2405 is an acceptable candidate set. In some embodiments, the process makes this determination by checking whether the specified set meets a set of constraints. These constraints can relate to some desired numerical attribute or attributes of the candidate vector set (such as the average length of vectors in the set, the maximum edge length, the total edge length) or some other constraint related to the candidate vector set (e.g., congestion based metrics based on the expected congestion caused by a candidate vector set). Some embodiments use only one constraint (e.g., the average vector length) while other embodiments use multiple constraints. Also, some embodiments compute vector lengths by assuming a Euclidean ("all-angle") wiring, while other embodiments compute lengths based on other wiring models, such as a Manhattan model, an octilinear model, a hexalinear model, etc.

When the process determines (at 2410) that the candidate vectors set is acceptable, the process evaluates (at 2420) the candidate vector set. One example of such an evaluation will be described below by reference to FIG. 25. As further described below, the evaluation process of FIG. 25 generates other candidate vector sets that have a symmetrical relationship to the vector set specified at 2405, and then uses all the candidate sets to compute a metric score that relates to the number of unique nodes that are reachable from other nodes through different number of hops, where, as mentioned above, a hop refers to a direct connection between two nodes.

After evaluating the candidate vector set, the process determines (at 2425) whether the candidate vector set resulted in the best solution that it has generated thus far. In some embodiments, the process makes the determination at 2425 based on the metric score computed by the evaluation process at 2420. If the process determines (at 2425) that the candidate vector set did not result in the best solution, the process transitions to 2415, which will be further described below. On the other hand, when the candidate vector set results in the best solution, the process records (at 2430) the candidate vector set as the best solution. In some embodiments, the process records (at 2430) not only the candidate vector set specified at 2405 but also its symmetrically related vector sets that the evaluation process 2500 of FIG. 25 generates. After 2430, the process transitions to 2415. The process also transitions to 2415 when it determines (at 2410) that the candidate vector set is not acceptable.

At 2415, the process determines whether it has examined sufficient number of candidate vector sets. When the process determines (at 2415) that it has examined a sufficient number of candidate vector sets, the process returns to 2405 to start its operation again. Otherwise, the process ends. In some embodiments, the process 2400 loops automatically without the stopping criteria at 2415, until the process is stopped by an operator or another process.

Figure 25:
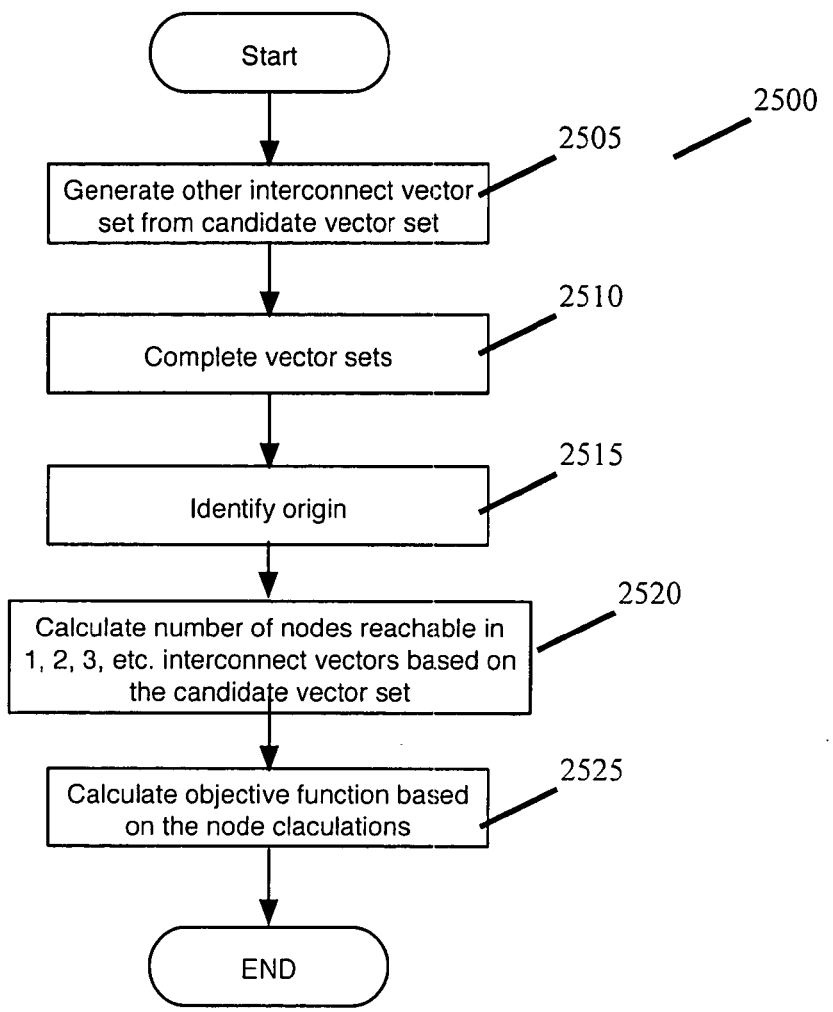

FIG. 25 illustrates a process 2500 that some embodiments use to perform the evaluation operation 2420 of the process 2400. As shown in this figure, the process 2500 initially generates (at 2505) other candidate vector sets that have a symmetrical relationship to the vector set specified at 2405. In some embodiments, the process 2500 generates the vector sets by using one of the symmetrical relationships that were described above by reference to FIGS. 18-23.

Next, in some embodiments, the process adds (at 2510) to each vector set the set of vectors that are common among the vectors sets. For instance, in some embodiments, each vector set will include the four unit vectors in the horizontal and vertical directions (i.e, will include (1,0), (0,1), (−1,0), and (0,−1)). Accordingly, in these embodiments, the process adds (at 2510) these four unit vectors to each vector set.

After 2510, the process selects (at 2515) a node in the array as its origin. In some embodiments, this node is the node that is closest to the center of the array. Based on the candidate vector sets generated at 2505 and completed at 2510, the process then calculates (at 2520) all nodes that can be reached from the designated node origin in different number of hops (e.g., 1, 2, 3, etc.). Some embodiments use a breadth-first search to perform this calculation.

Based on the calculated numbers, the process then computes a metric score at 2525. Some embodiments use the following equation to compute a metric score.

$$\text{Score} = \frac{\sum_{i=0}^{X} i * R(i) - R(i-1)}{R(X)}, \quad (1)$$

where R is the calculated number of nodes that are reachable within one to i hops, n is the number of rows or number of columns, in a node array that may or may not be a square array, and X is an integer (e.g., 5, 10, 100, 1000, etc.). This score approximates the expected length from the origin (i.e., the node selected at 2515) to a random node in the array.

Other embodiments use either of the following equations in place of, or in conjunction with, the equation (1) above.

$$\text{Score} = \sum_{i=0}^{10} \frac{R(i)}{i}, \quad (2)$$

$$\text{Score} = \sum_{i=0}^{10} \frac{R(i)}{i^2}, \quad (3)$$

where R and i are as defined above for equation (1). To use the scores of several of the above equations in conjunction with each other, some embodiments compute a blended sum of these scores.

After 2525, the process 2500 ends.

Table 5 provides metric scores that are generated by equation (1) for different connection schemes that are produced by using the processes 2400 and 2500 of FIGS. 24 and 25 under different sets of constraints for different sized node arrays. The constraints are the number of non-unit/offset vectors in the connection scheme and the total length of the non-unit/offset vectors. Each of these connections schemes also has four unit vectors connecting the node to its four nearest neighboring nodes in the horizontal and vertical directions. Table 5 also illustrates the number of nodes that are reachable from a given node in three hops on average.

TABLE 5

| Number of Offset or Non-Unit Vectors | Total Length of Offset or Non-Unit Vectors | Score in a 100 × 100 node array | Score in a 70 × 70 node array | Score in a 40 × 40 node array | Nodes reachable in 3 hops |
|---|---|---|---|---|---|
| 4 | 80 | 7.95 | 6.64 | 4.89 | 115.5 |
| 4 | 128 | 6.81 | 5.65 | 4.26 | 340 |
| 4 | 176 | 6.06 | 5.17 | 3.92 | 477.5 |

Figure 1:
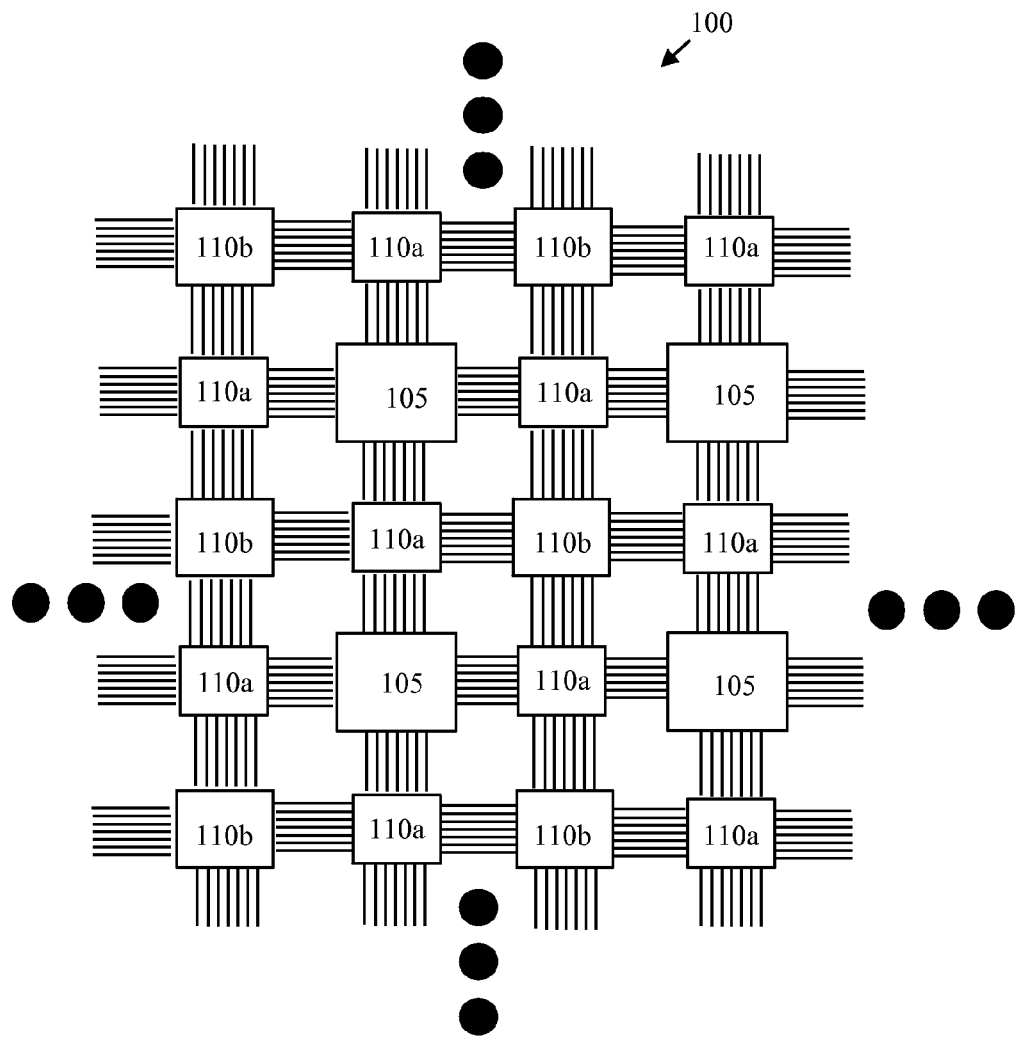
FIG. 1 illustrates an array structure of a prior art FPGA.
Figure 2:
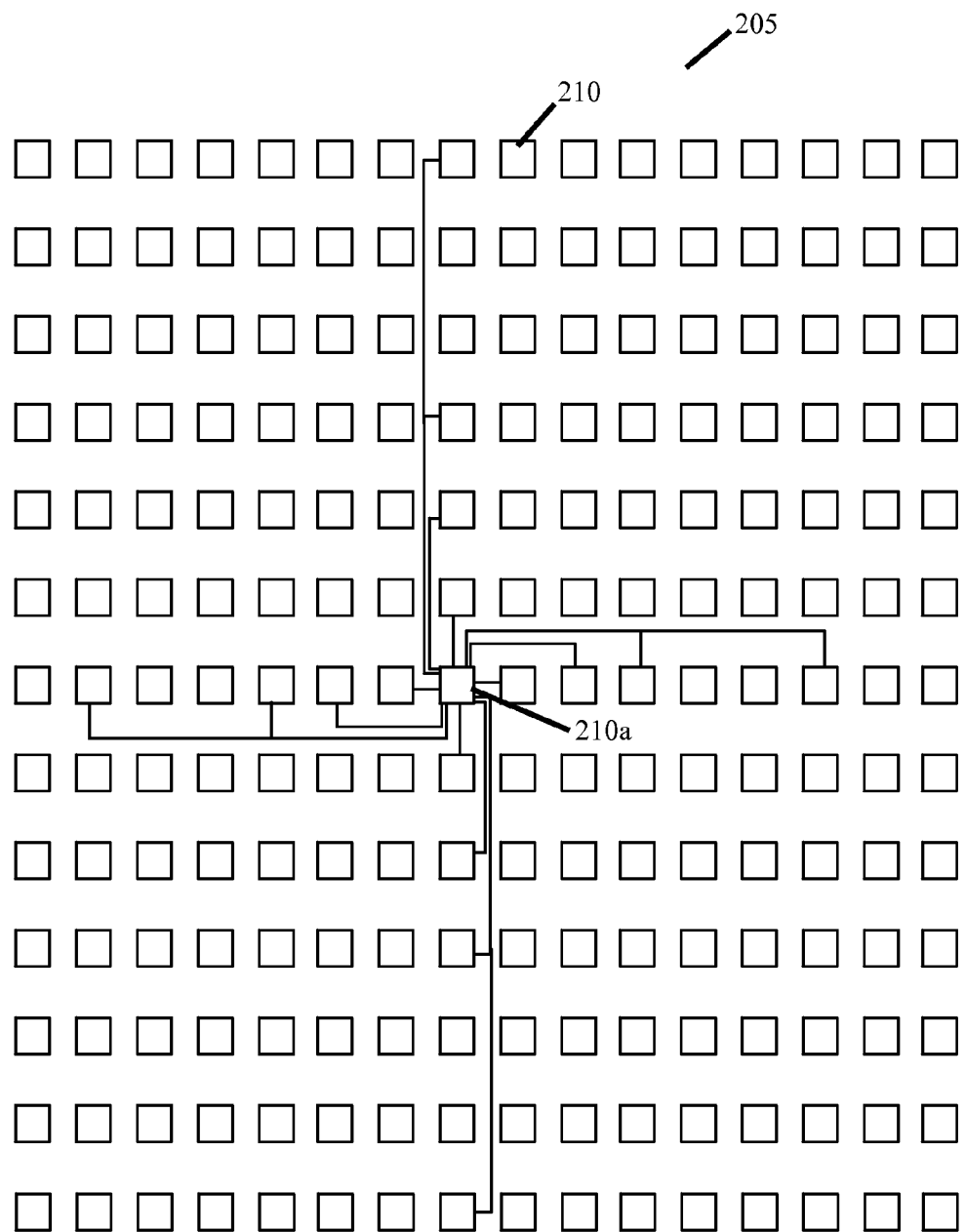
FIG. 2 illustrates several direction connections in a prior configurable node architecture.
Figure 3:
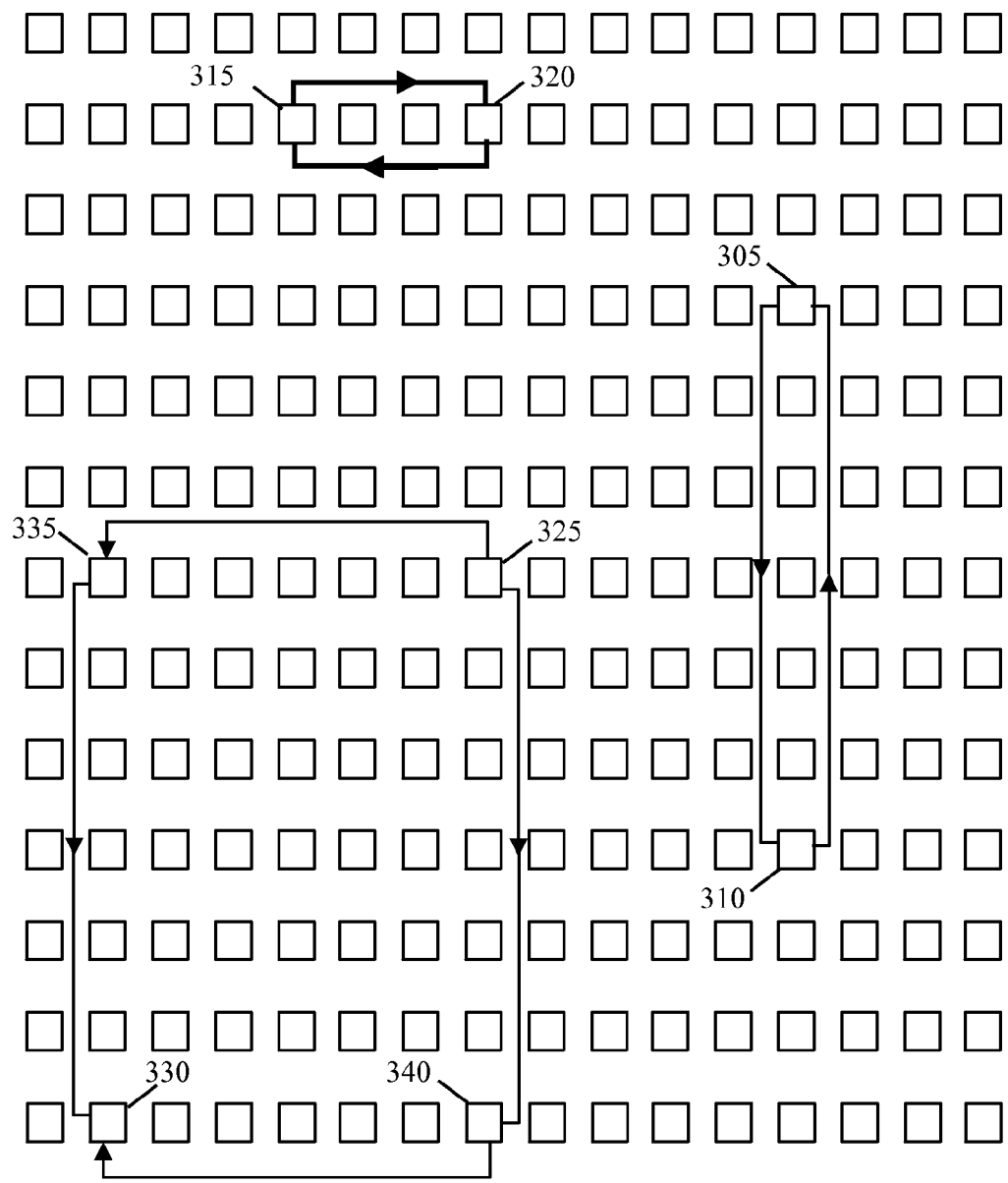
FIG. 3 illustrates shortcomings of the architecture presented in FIG. 2.

Table 6 provides a comparable set of numbers for a configurable node array that is interconnected through the prior art connection scheme illustrated in FIG. 2. Specifically, the second row in this table identifies the equation (1) metric score and hop data for a connection scheme that connects each node to nodes that are one, two, or three units away from it in the horizontal or vertical directions. The third row identifies the score and hop data for a connection scheme that connects each node to nodes that are one, two, six units away from it in the horizontal or vertical directions. The fourth row identifies the score and hop data for a connection scheme that connects each node to nodes that are one, two, three, or six units away from it in the horizontal or vertical directions.

TABLE 6

| Vectors | Total Length of Offset/Non-Unit Vectors | Score in a 100 × 100 node array | Score in a 70 × 70 node array | Score in a 40 × 40 node array | Nodes reachable in 3 hops |
|---|---|---|---|---|---|
| (0, 1) (1, 0) (0, −1) (−1, 0) (0, 2) (2, 0) (0, −2) (−2, 0) (0, 3) (3, 0) (0, −3) (−3, 0) | 80 | 17.3 | 12.3 | 7.35 | 145 |
| (0, 1) (1, 0) (0, −1) (−1, 0) (0, 2) (2, 0) (0, −2) (−2, 0) (0, 6) (6, 0) (0, −6) (−6, 0) | 128 | 10.1 | 7.7 | 5.12 | 241 |
| (0, 1) (1, 0) (0, −1) (−1, 0) (0, 2) (2, 0) (0, −2) (−2, 0) (0, 3) (3, 0) (0, −3) (−3, 0) (0, 6) (6, 0) (0, −6) (−6, 0) | 176 | 9.82 | 7.33 | 4.8 | 321 |

The second, third, and fourth rows in Table 6 are comparable to the second, third, and fourth rows in Table 5 as the total length of vectors of the connection schemes of these rows are equal. As it can be seen by comparing the score and hop data of the comparable rows in Tables 5 and 6, the connection schemes that result from the constraints specified in Table 5 result in distinctly better scores and hop values. Such better scores and hop values are because the processes 2400 and 2500 examine numerous connection schemes and select the one that results in the best metric score.

Although the processes 2400 and 2500 was described above, one of ordinary skill will realize that other embodiments can use a variety of other processes to specify different direct-connection schemes for different configurable nodes in a configurable node array. As mentioned above, these processes might use a variety of other optimization techniques, such as local optimization, simulated annealing, etc. Also, some embodiments use several different connection schemes for a configurable node array, with at least two of the connection schemes specifying a different number of long-offset direction connections (e.g., one connection scheme might specify four long-offset direct connections, while another connection scheme might specify six long-offset direct connections).

Instead of generating a first connection scheme and generating the other connection schemes based on the first scheme, some embodiments might partially generate two or more of the connection schemes and then generate the remaining connections based on symmetrical relationships with the partially generated connections of the two or more connection schemes. For instance, some embodiments might generate one vector for each connection scheme, and then rotate each of these vectors through the various symmetrical angles in order to generate the additional vectors of the connection schemes. Alternatively, some embodiments might completely generate two or more of the connection schemes independently from each other.

As mentioned above, the process 2500 selects (at 2515) one node in the array and computes (at 2520) the number of nodes reachable from the selected node in a set number of hops. This process then uses the computed number of nodes in calculating its metric score at 2525. Other embodiments, however, select (at 2515) several different nodes in the array, calculate (at 2520) the number of nodes reachable from these selected nodes, and then compute (at 2525) the metric score based on the number calculated at 2520. For instance, some embodiments calculate (at 2520) the number of reachable nodes for each node in the array. Some of these embodiments then (at 2520) generate an average of these numbers, and use (at 2525) this generated average to generate their metric scores at 2525.

V. Configurable Node Array With Built-In Turns

Some embodiments of the invention are IC's with configurable node arrays that have a systematic series of build-in turns. Such turns can be arranged in a variety of different architectural schemes, such as symmetrical schemes, asymmetrical schemes, nested schemes, any combination of symmetrical, asymmetrical, and/or nested schemes, etc.

Figure 26:
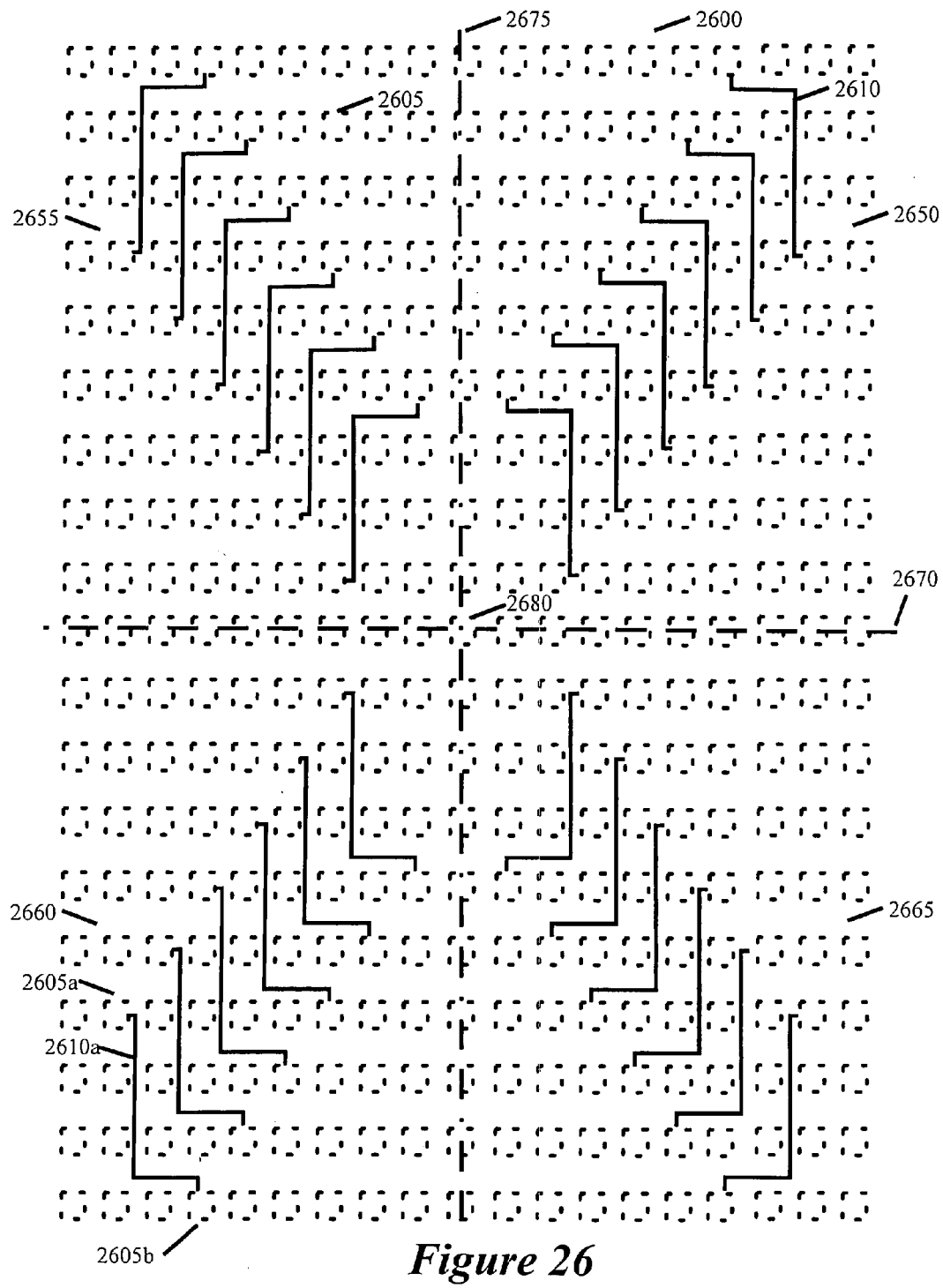
FIGS. 26-30 illustrate several examples of configurable nodes with built-in turns.

FIGS. 26-30 illustrate several examples of symmetrical schemes. FIG. 26 illustrates a configurable node array 2600 that has numerous configurable nodes 2605, which are arranged in numerous rows and columns. In some embodiments, the configurable nodes 2605 are all the same type of nodes. For instance, in some embodiments, all the nodes have the same circuit structure (e.g., the same circuit elements). In some embodiments, similar type nodes have the same circuit elements and the same internal wiring between the circuit elements.

Figure 27:
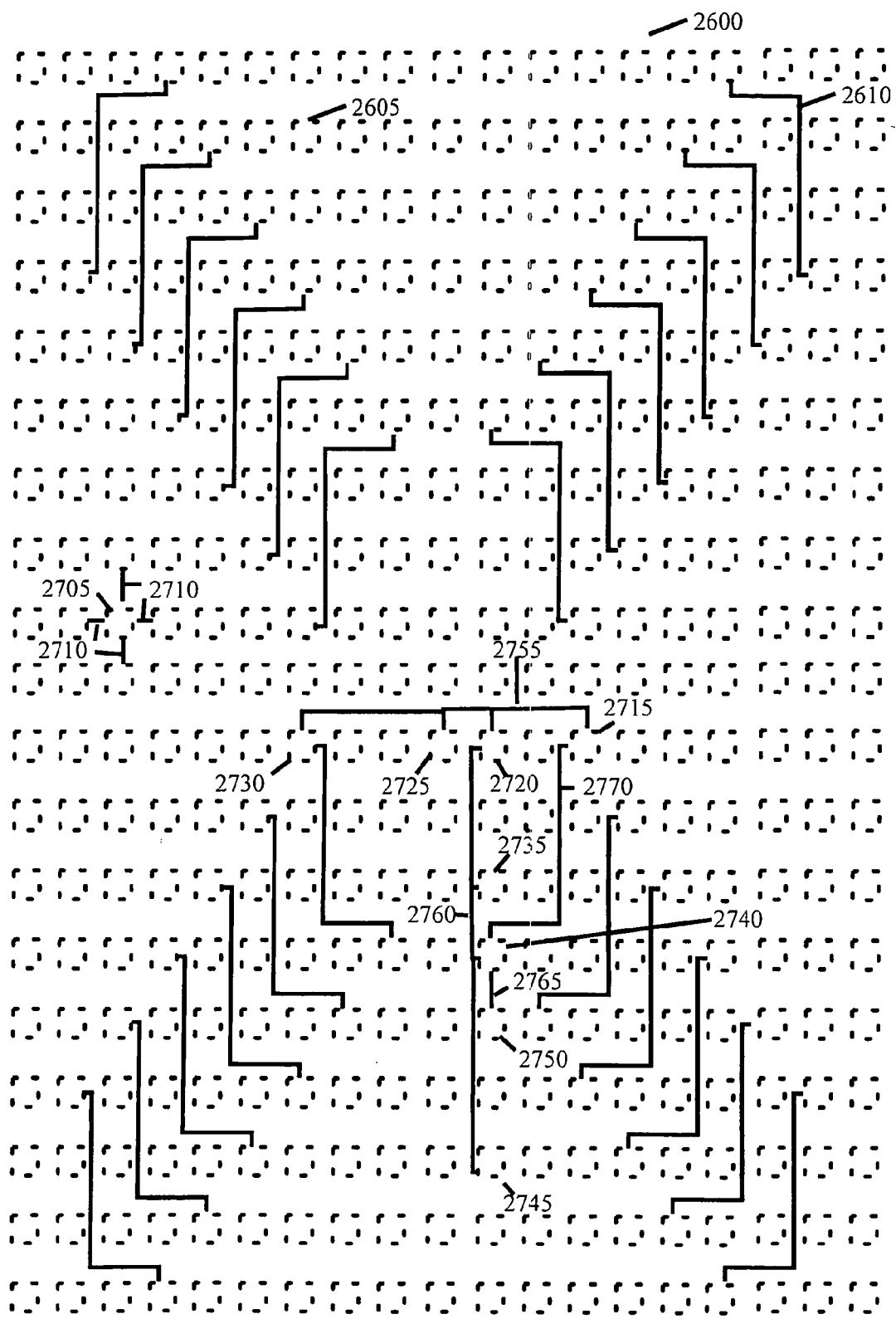

In some embodiments, the array 2600 has numerous direct connections (not shown) between pairs of neighboring nodes that are horizontally or vertically aligned (i.e., that are in the same row or column in the array). FIG. 27 illustrates one such set of direct connections 2710 for a node 2705 in the array 2600. Some embodiments have such direct connections between each pair of horizontally or vertically aligned nodes in the array. In conjunction or instead of such connections between pairs of neighboring aligned nodes, the configurable node array 2600 in some embodiments also has direct connections between horizontally or vertically aligned nodes that are not neighboring nodes in the array. For instance, FIG. 27 illustrates that the array 2600 has, in some embodiments, a node 2715 that connects to non-neighboring nodes 2720, 2725, and 2730 that are horizontally aligned with node 2715. This figure also illustrates that the node 2720 connects to non-neighboring nodes 2735, 2740, and 2745 that are vertically aligned with it.

In addition to the direct connections between horizontally and vertically aligned nodes, the array 2600 includes numerous direct connections 2610 between nodes that are offset in the array. Specifically, as shown in FIG. 26, the array includes numerous direction connections 2610, where each such connection couples two nodes that are two columns and three rows separated in the array.

Such connections 2610 are referred to as "built-in turns." Built-in turns allow two offset nodes to be connected by relying on wiring architecture that reduces the number of interconnect circuits necessary for establishing the connection between the two nodes. For instance, as shown in FIG. 26, a built-in turn 2610a couples two offset nodes 2605a and 2605b without using any intervening interconnect circuit.

In some cases, built-in turns do not eliminate the need to rely on intervening interconnect circuits, but instead reduce the number of intervening interconnect circuits. For instance, in FIG. 27, nodes 2715 and 2750 can be connected through (1) the horizontal connection 2755 that connects nodes 2715 and 2720, (2) node 2720's interconnect circuit (not shown) that allows a change of direction in the set of connecting hops, (3) the vertical connection 2760 that connects nodes 2720 and 2740, (4) node 2740's interconnect circuit (not shown) that relays the signal on its input terminal connected to connection 2760 to its output terminal connected to connection 2765, and (5) the vertical connection 2765 between neighboring nodes 2740 and 2750.

Alternatively, as shown in FIG. 27, nodes 2715 and 2750 can be connected through (1) the built-in turn connection 2770 that connects nodes 2715 and 2740, (2) node 2740's interconnect circuit that relays the signal on its input terminal connected to connection 2770 to its output terminal connected to connection 2765, and (3) the vertical connection 2765 between neighboring nodes 2740 and 2750. Accordingly, this alternative connection scheme connects the two nodes 2715 and 2750 in two hops instead of the three hops that are required to connect these two nodes through nodes 2720 and 2740. Such a reduction typically reduces the length, and associated delay, of the wire segments necessary to establish the connection between two offset nodes.

Also, the alternative connection scheme that uses the turn connection 2770 reduces reliance on intervening interconnect circuits by eliminating node 2720's interconnect circuit from the connection path. Reducing the number of intervening interconnect circuits is often desirable. The use of interconnect circuits adversely affects the IC's operational speed, because it requires signals (1) to traverse from the higher wiring layers to the IC's substrate for processing by the relatively slow transistor-level logic and then (2) to traverse back to the higher wiring layers from the IC's substrate. Interconnect circuits also take valuable real estate on an IC. Therefore, it is often desirable to minimize the use of interconnect circuits so that they can be used only in situations were they are required.

Each built-in turn 2610 in FIGS. 26 and 27 is established by (1) a set of wire segments that traverse through a set of the IC's wiring layers, (2) a set of vias when two or more wiring layers are involved, and (3) possibly a set of buffer circuits. In some embodiments, all the wire segments of all built-in turns 2610 are on the same wiring layer (e.g., layer 4). In these embodiments, no built-in turn 2610 requires a via to connect the turn's four wire segments to each other. (The turns, however, might still require vias to connect to the input and output terminals of nodes in the array.)

Figure 28:
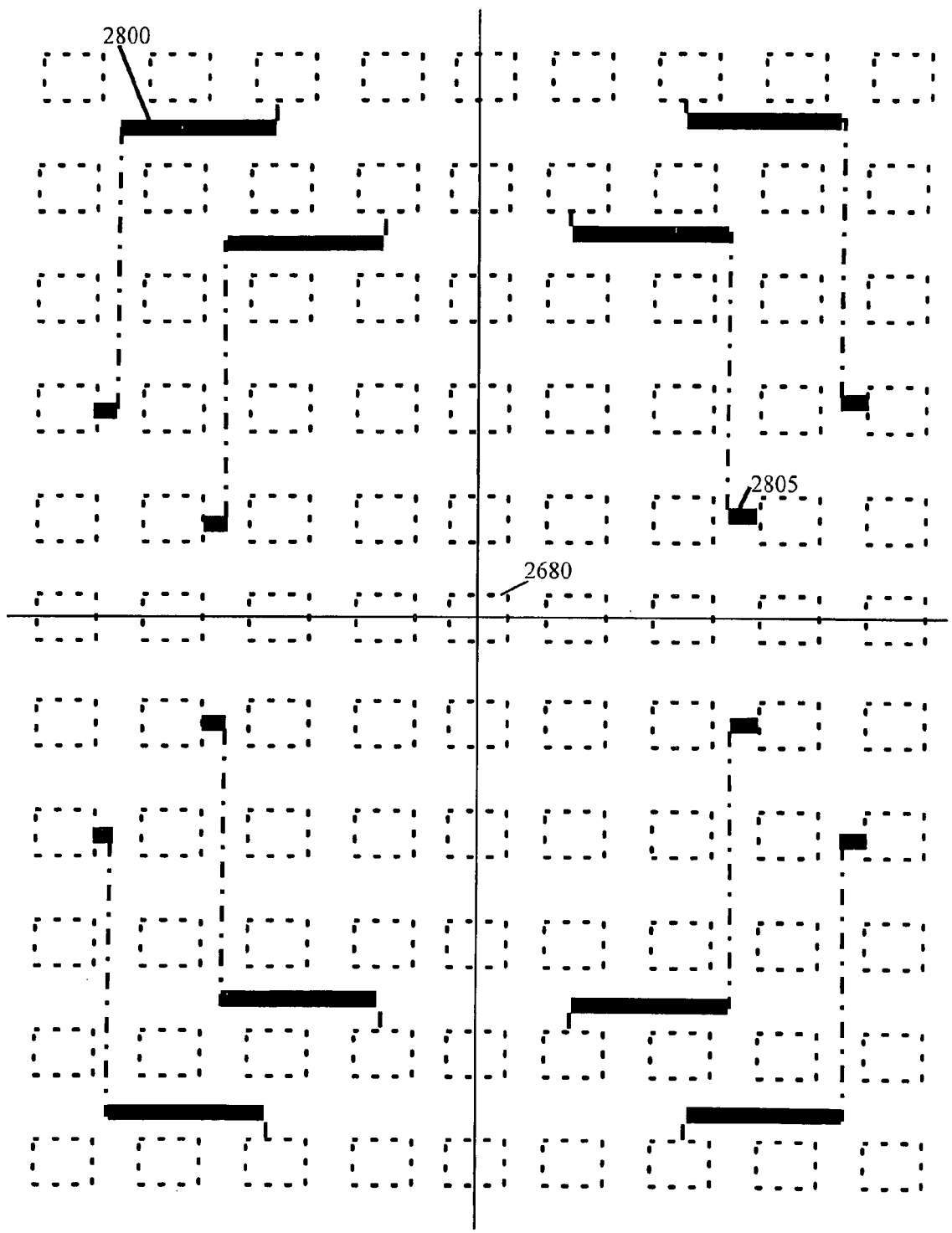
Figure 29:
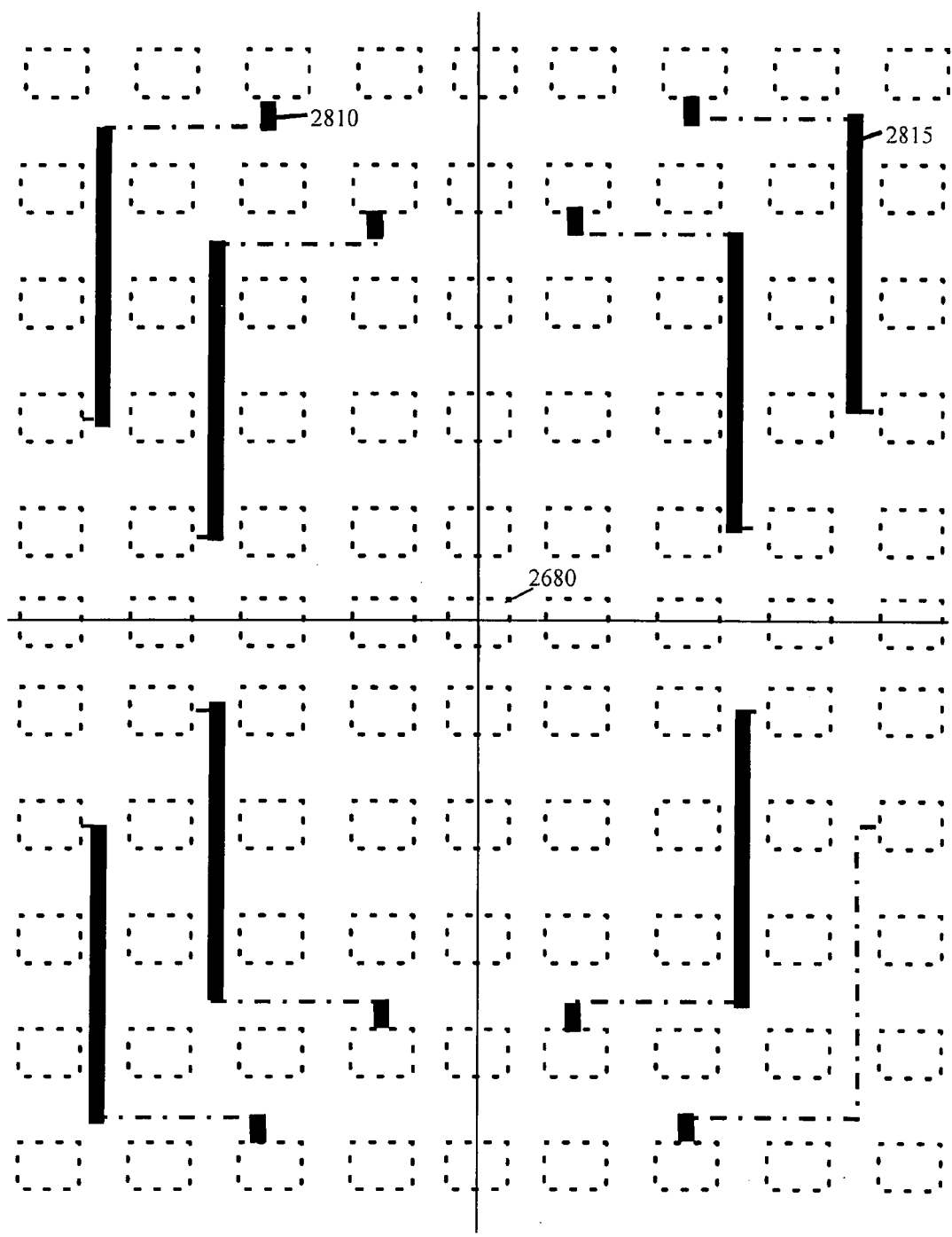

Alternatively, different wire segments of the built-in turns 2610 might be on different wiring layers. For instance, FIGS. 28 and 29 illustrate an alternative architecture for the array 2600 where all the horizontal segments 2800 and 2805 of the turns 2610 are on one wiring layer (e.g., the fourth layer), while all the vertical segments 2810 and 2815 of the turns 2610 are on another wiring layer (e.g., the fifth layer). Such an arrangement would require each turn 2610 to have several (e.g., three) vias to connect its four wire segments 2800, 2805, 2810, and 2815 to each other.

Yet other alternative arrangements can be used in other embodiments, where the wire segments of different built-in turns 2610 of the array 2600 are arranged differently. For instance, in some embodiments, different turns 2610 might have their wiring segments on different wiring layers (e.g., some might have their horizontal segments on layer 4, while others might have their horizontal segments on layer 5). Also, in some embodiments, some turns 2610 might have all their segments on the same wiring layer, while other turns 2610 might have their wiring segments on different wiring layers.

As illustrated in FIGS. 26 and 27, the built-in turns 2610 are a set of turns that are systematically arranged across the entire node array or a portion of this array. These turns are arranged symmetrically in some embodiments. For instance, as illustrated FIG. 26, the turns 2610 can be categorized into four sets of turns that are horizontally and/or vertically symmetrically laid out in the array 2600 about an origin 2680 in the array. These four sets are in four quadrants 2650, 2655, 2660, and 2665 of a coordinate system that is specified by an x- and y-axes 2670 and 2675 running through the origin 2680. Each particular set has a symmetrical relationship with the other three sets, as flipping the particular set about the origin in the horizontal and/or vertical directions can generate the other three sets.

Figure 30:
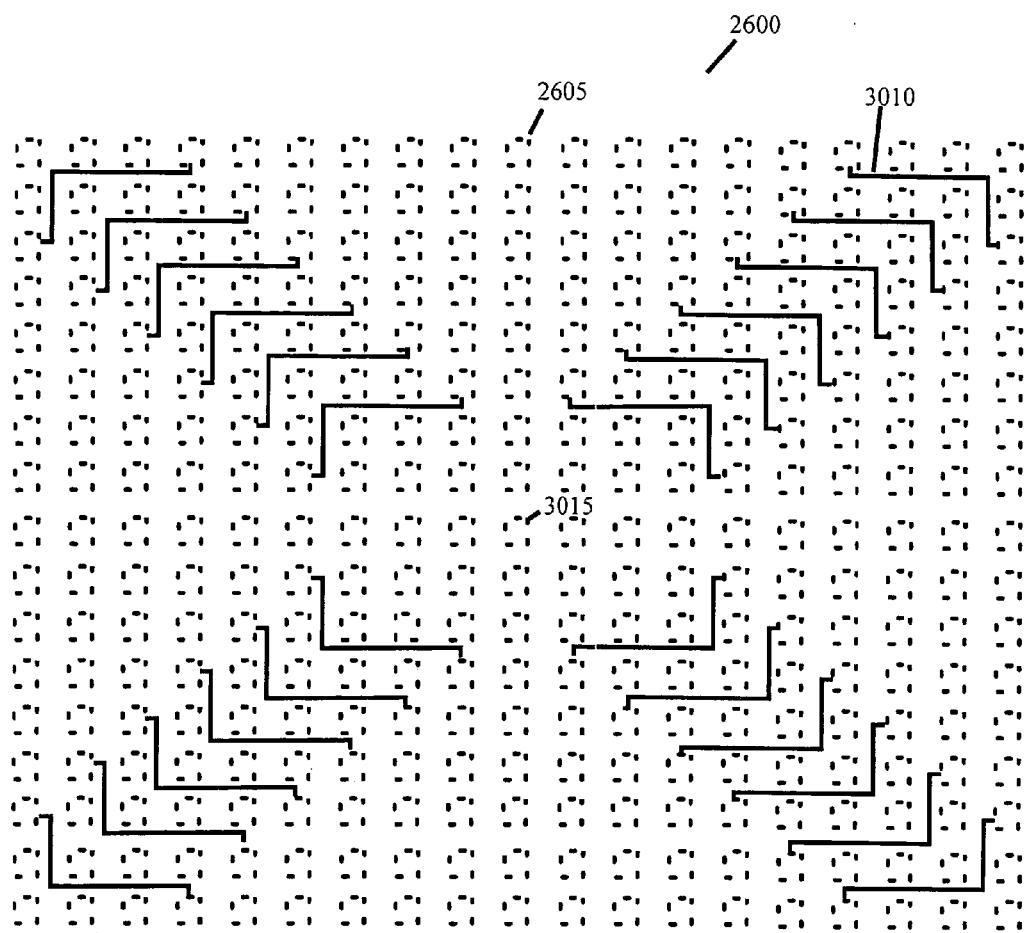

Some embodiments define multiple sets of built-in turns that have multiple sets of symmetrical relationships with each other. For instance, in addition to the four sets of symmetrically arranged turns 2610 of FIG. 26, some embodiments define another set of turns that are symmetrical to each other and perhaps to the turns 2610. For the array 2600, FIG. 30 illustrates another set of symmetrically arranged turns 3010.

Each of the turns 3010 connects two nodes 2605 in the array that are separated by three columns and two rows.

Like each turn 2610, each turn 3010 can be established by (1) a set of wire segments that traverse through a set of the IC's wiring layers, (2) a set of vias when two or more wiring layers are involved, and (3) possibly one or more buffer circuits. Like the turns 2610, the turns 3010 can also be categorized into four sub-sets of turns that are laid out horizontally and/or vertically symmetrically in the array an origin 3015 in the array. In addition, the turns 3010 are symmetrically related to the turns 2610 as they are rotated versions of the turns 2610.

Figure 31:
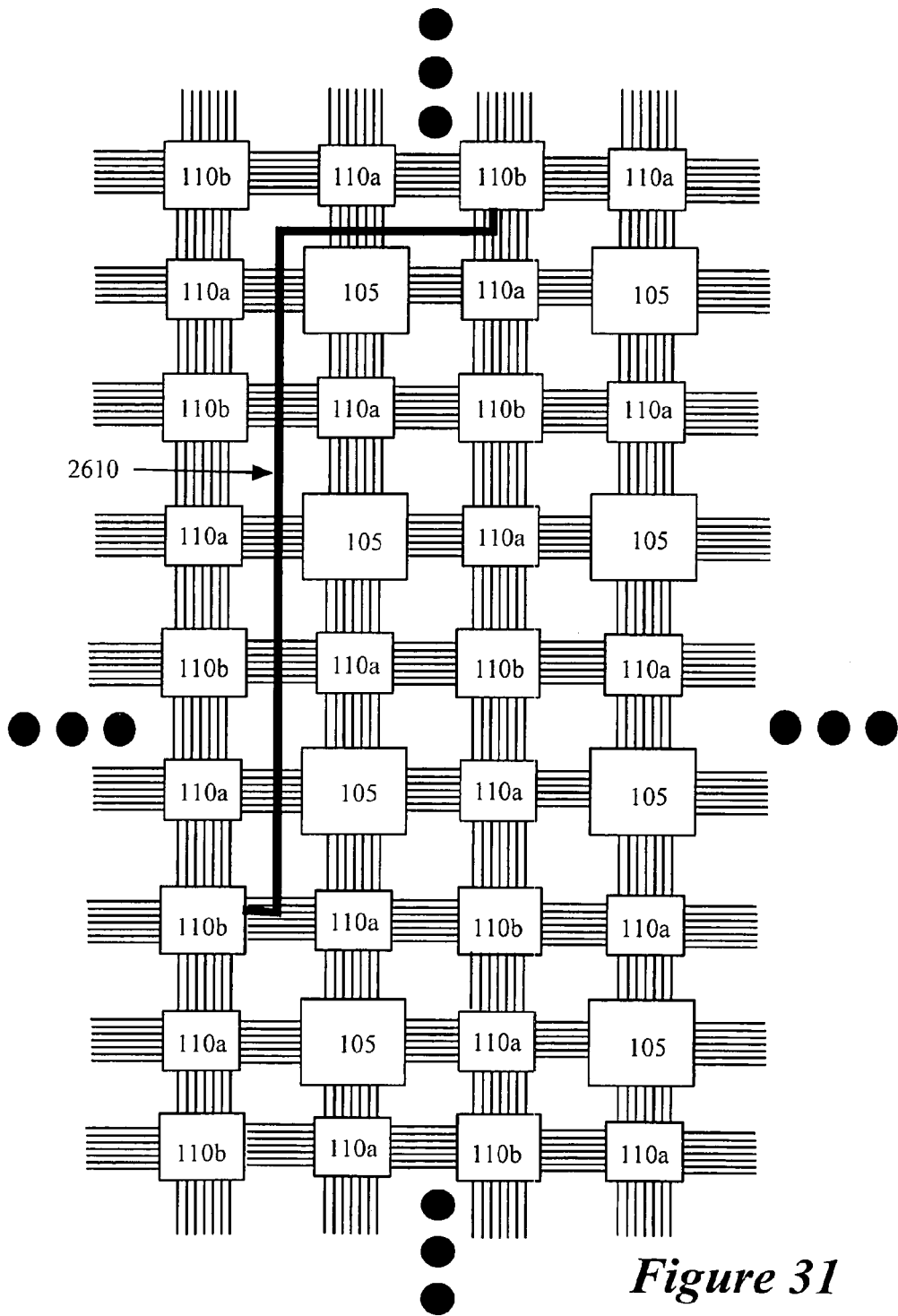
FIG. 31 illustrates an example of a built-in turn in a traditional island style architecture.

As mentioned above, the configurable nodes 2605 are all the same type of nodes in some embodiments. For instance, in some embodiments, all the nodes have the same circuit structure (i.e., the same circuit elements) and perhaps the same internal wiring. One example of such nodes would be switch boxes in a traditional island style architecture. FIG. 31 illustrates an example of a built-in turn 2610 in this architecture.

Although several sets of built-in turns were described above by reference to FIGS. 26-31, one of ordinary skill will realize that other embodiments might use numerous other styles of built-in turns, as well as numerous other architectural layouts of such turns. For instance, the configurable node array 2600 does not have the direct connections between nodes 2715, 2720, 2725, and 2730, and/or between nodes 2720, 2735, 2740, and 2745 in some embodiments.

Figure 32:
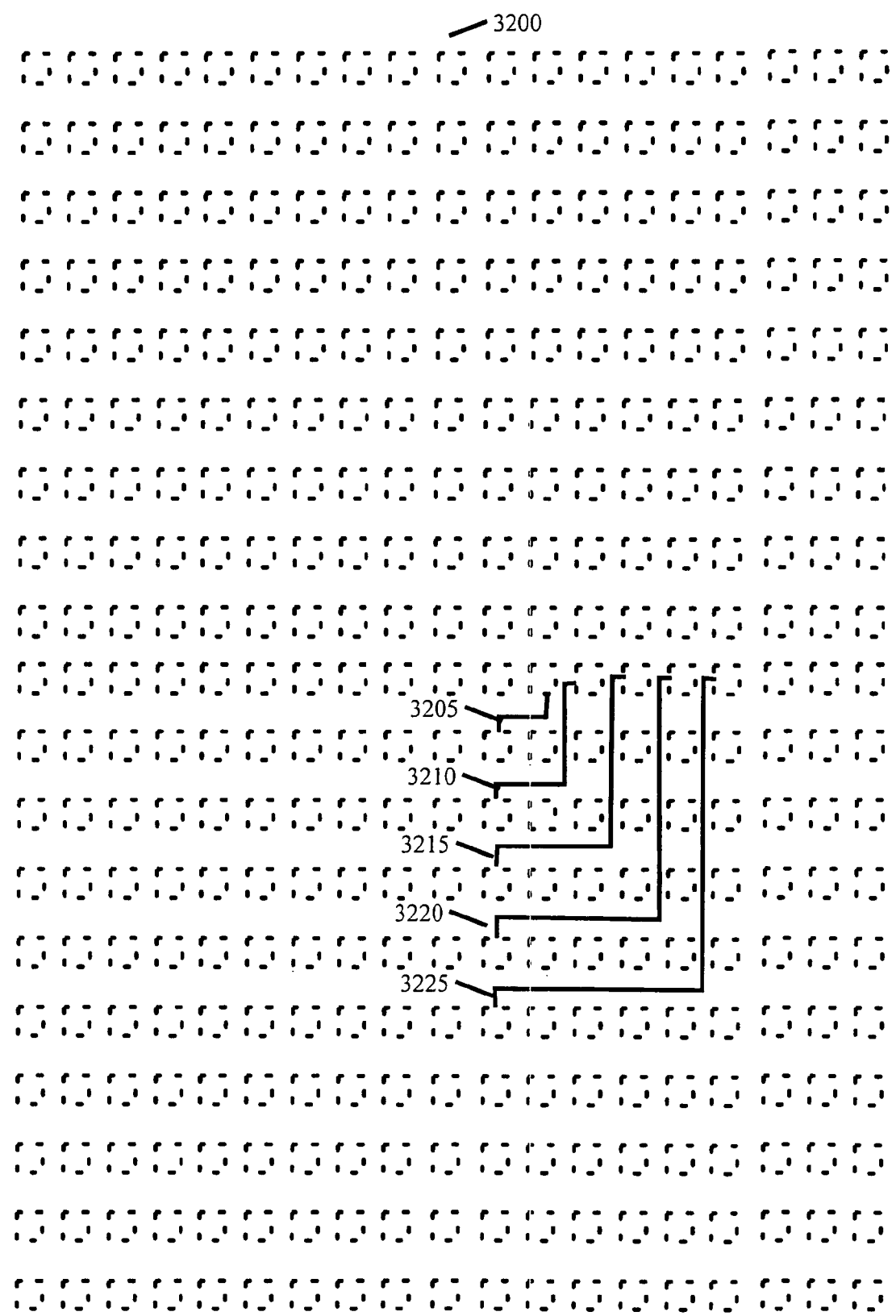
FIG. 32 illustrates a configurable node array with a nested set of built-in turns.
Figure 33:
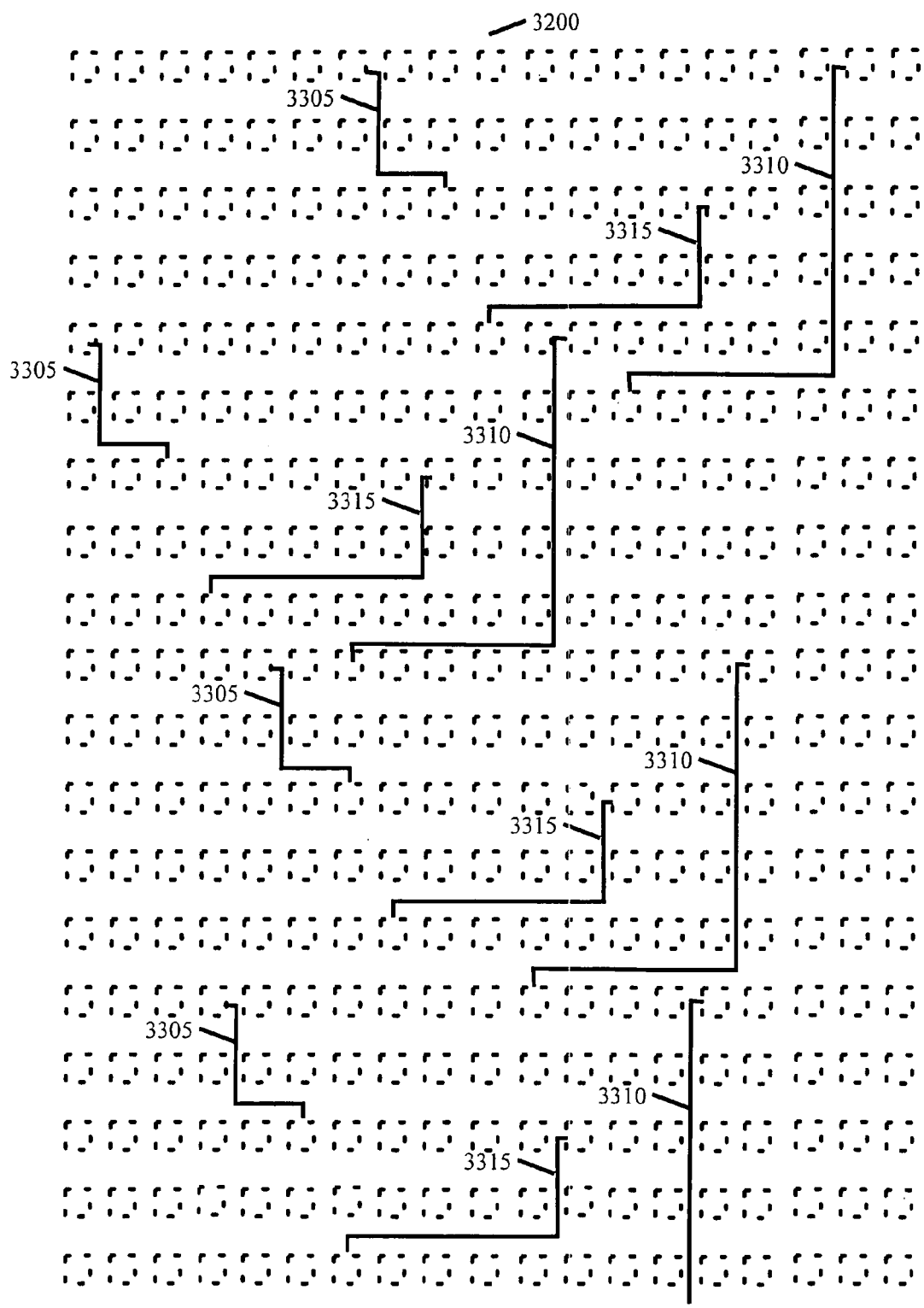
FIG. 33 illustrates a configurable node array that has a set of asymmetrical built-in turns that are repeated throughout a portion or the entire array.

Also, FIG. 32 illustrates a configurable node array 3200 with a nested set of built-in turns. This set of turns includes five turns 3205, 3210, 3215, 3220, and 3225 that connect five pairs of nodes. FIG. 33 illustrates a configurable node array 3300 that has a set of asymmetrical built-in turns that are repeated throughout a portion or the entire array. This asymmetrical set includes three turns 3305, 3310, and 3315.

Like the turns illustrated in FIGS. 26-30, the turns illustrated in FIGS. 32 and 33 can defined by (1) a set of wire segments that traverse through a set of the IC's wiring layers, (2) a set of vias when two or more wiring layers are involved, and (3) possibly a set of buffer circuits. For instance, in some embodiments, the turns in FIGS. 32 and 33 are on the same wiring layer (e.g., layer 4). In these embodiments, no built-in turn requires a via to connect the turn's wire segments to each other. (The turns, however, might still require vias to connect to the input and output terminals of nodes in the array.) Alternatively, in some embodiments, different wire segments of the built-in turns are on different wiring layers. Also, as mentioned above, some embodiments use a combination of symmetrical, asymmetrical, and/or nested turns.

VI. Configurable IC And System

Figure 34:
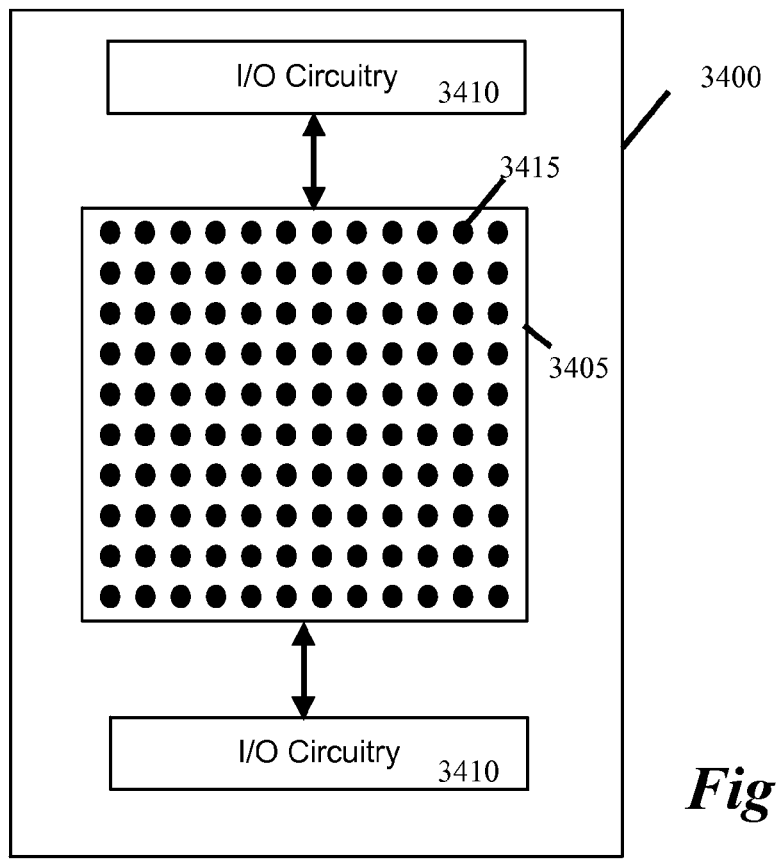
FIG. 34 illustrates a configurable IC of some embodiments of the invention.

FIG. 34 illustrates a portion of a configurable IC 3400 of some embodiments of the invention. As shown in this figure, this IC has a configurable node array 3405 and I/O circuitry 3410. The node array 3405 can be any of the invention's configurable nodes arrays that were described above. The I/O circuitry 3410 is responsible for routing data between the configurable nodes 3415 of the array 3405 and circuits outside of the array (i.e., circuits outside of the IC, or within the IC but outside of the array 3405). As further described below, such data includes data that needs to be processed or passed along by the configurable nodes.

Figure 35:
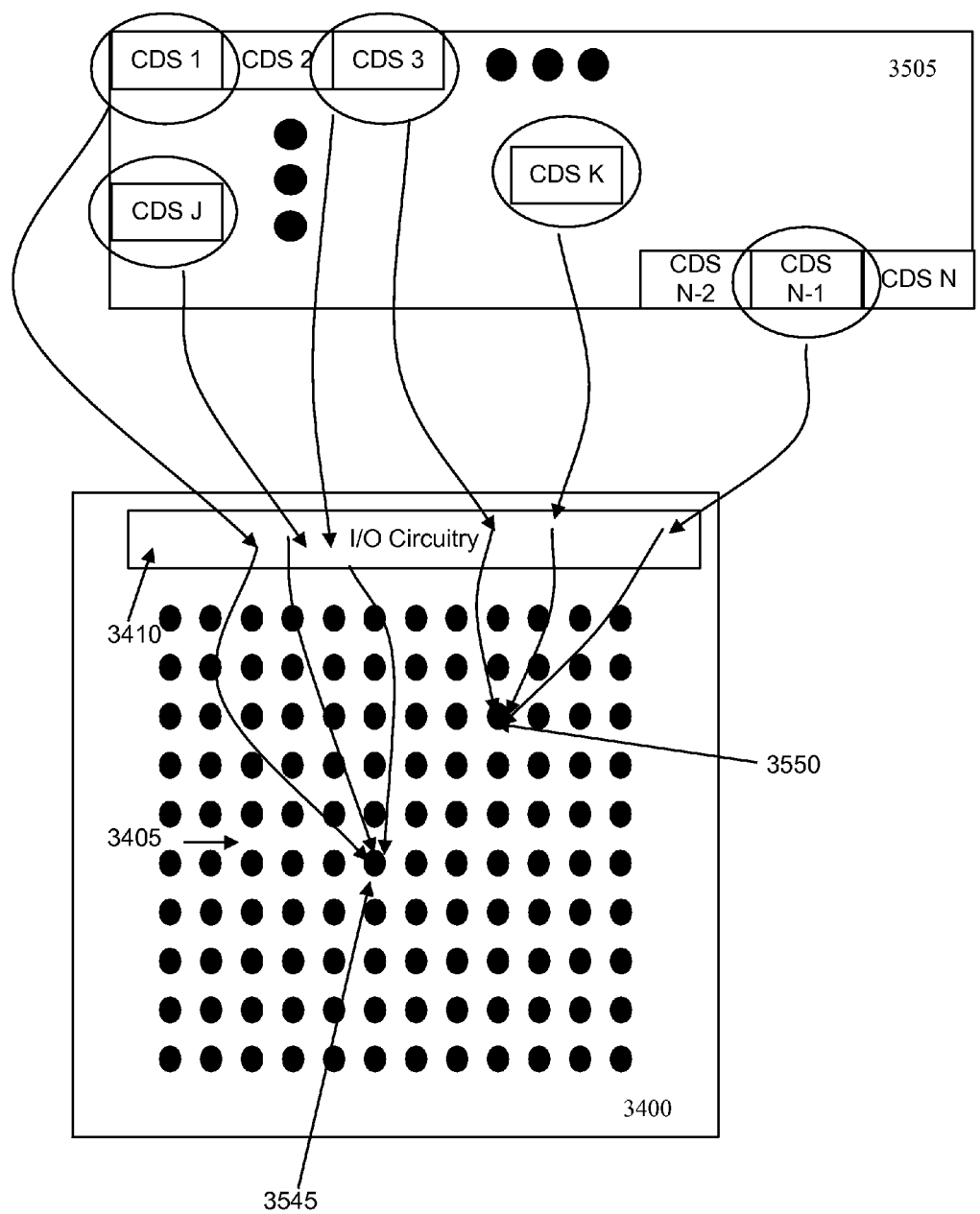
FIG. 35 illustrates a configuration data pool of a configurable IC of some embodiments of the invention.

The data also includes in some embodiments configuration data that configure the nodes to perform particular operations. FIG. 35 illustrates a more detailed example of this. Specifically, this figure illustrates a configuration data pool 3505 for the configurable IC 3400. This pool includes N configuration data sets (CDS). As shown in FIG. 35, the input/output circuitry 3410 of the configurable IC 3400 routes different configuration data sets to different configurable nodes of the IC 2600. For instance, FIG. 35 illustrates configurable node 3545 receiving configuration data sets 1, 3, and J through the I/O circuitry, while configurable node 3550 receives configuration data sets 3, K, and N−1 through the I/O circuitry. In some embodiments, the configuration data sets are stored within each configurable node. Also, in some embodiments, a configurable node can store multiple configuration data sets so that it can reconfigure quickly by changing to another configuration data set. In some embodiments, some configurable nodes store only one configuration data set, while other configurable nodes store multiple such data sets.

Figure 36:
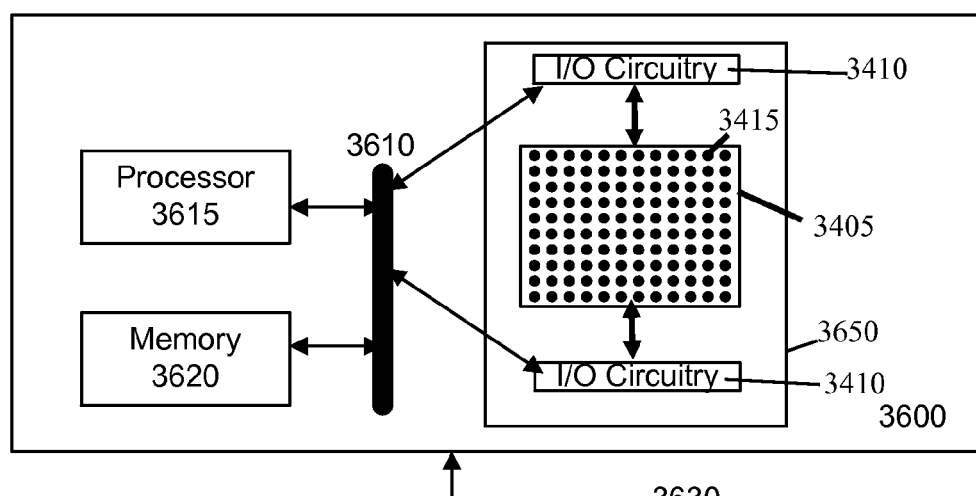
FIG. 36 illustrates an alternative configurable IC of some embodiments of the invention.

A configurable IC of the invention can also include circuits other than the configurable node array and I/O circuitry. For instance, FIG. 36 illustrates one such IC 3600. This IC has a configurable block 3650, which includes a configurable node array 3405 and I/O circuitry 3410 for this array. It also includes a processor 3615 outside of the array, a memory 3620, and a bus 3610, which conceptually represents all conductive paths between the processor 3615, memory 3620, and the configurable block 3650. As shown in FIG. 36, the IC 3600 couples to a bus 3630, which communicatively couples the IC to other circuits, such as an off-chip memory 3625. Bus 3630 conceptually represents all conductive paths between the components of the IC 3600.

This processor 3615 can read and write instructions and/or data from an on-chip memory 3620 or an offchip memory 3625. The processor 3615 can also communicate with the configurable block 3650 through memory 3620 and/or 3625 through buses 3610 and/or 3630. Similarly, the configurable block can retrieve data from and supply data to memories 3620 and 3625 through buses 3610 and 3630.

Figure 37:
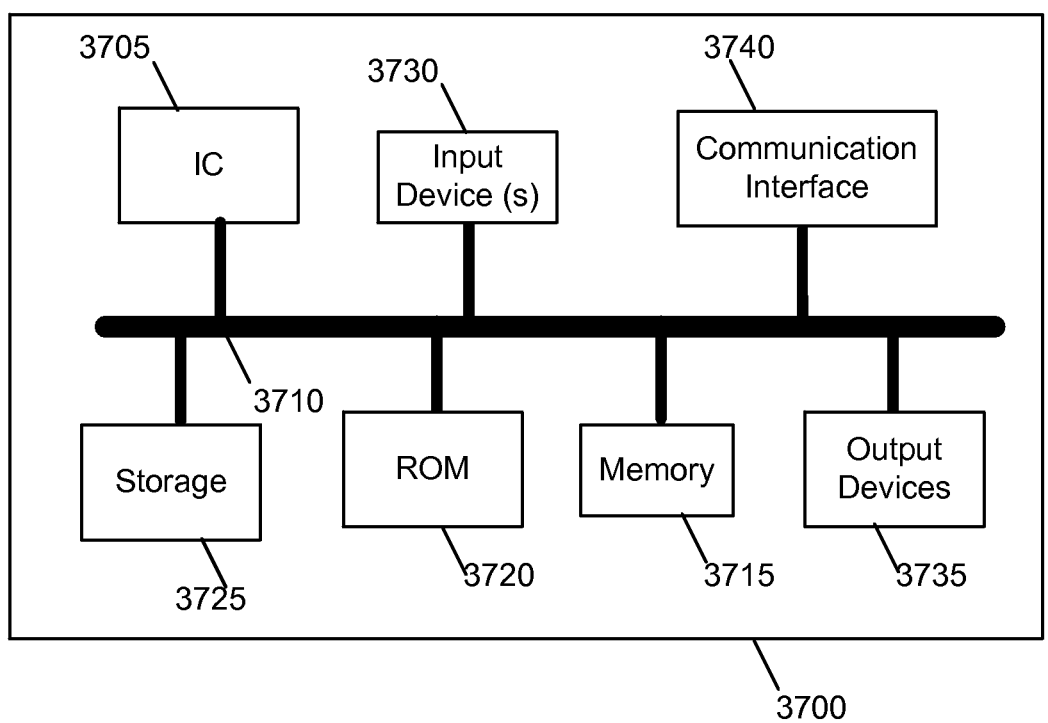
FIG. 37 conceptually illustrates a more detailed example of a computing system that has a configurable IC according to some embodiments of the invention.

FIG. 37 conceptually illustrates a more detailed example of a computing system 3700 that has an IC 3705, which includes one of the invention's configurable node arrays that were described above. The system 3700 can be a standalone computing or communication device, or it can be part of another electronic device. As shown in FIG. 37, the system 3700 not only includes the IC 3705, but also includes a bus 3710, a system memory 3715, a read-only memory 3720, a storage device 3725, input devices 3730, output devices 3735, and communication interface 3740.

The bus 3710 collectively represents all system, peripheral, and chipset interconnects (including bus and non-bus interconnect structures) that communicatively connect the numerous internal devices of the system 3700. For instance, the bus 3710 communicatively connects the IC 3710 with the read-only memory 3720, the system memory 3715, and the permanent storage device 3725.

From these various memory units, the IC 3705 receives data for processing and configuration data for configuring the IC's configurable logic and/or interconnect circuits. When the IC 3705 has a processor, the IC also retrieves from the various memory units instructions to execute. The read-only-memory (ROM) 3720 stores static data and instructions that are needed by the IC 3710 and other modules of the system 3700. The storage device 3725, on the other hand, is read-and-write memory device. This device is a non-volatile memory unit that stores instruction and/or data even when the system 3700 is off. Like the storage device 3725, the system memory 3715 is a read-and-write memory device. However, unlike storage device 3725, the system memory is a volatile read-and-write memory, such as a random access memory. The system memory stores some of the instructions and/or data that the IC needs at runtime.

The bus 3710 also connects to the input and output devices 3730 and 3735. The input devices enable the user to enter information into the system 3700. The input devices 3730 can include touch-sensitive screens, keys, buttons, keyboards, cursor-controllers, microphone, etc. The output devices 3735 display the output of the system 3700.

Finally, as shown in FIG. 37, bus 3710 also couples system 3700 to other devices through a communication interface 3740. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. An integrated circuit ("IC") comprising:
    a plurality of configurable nodes arranged in an array having a plurality of rows and a plurality of columns, the plurality of configurable nodes comprising a first group of configurable nodes aligned along a first direction and a second group of configurable nodes aligned along a second direction, wherein the first direction and second direction intersect at a particular location;
    a set of nested direct offset connections comprising (i) a first direct offset connection that connects a first node from the first group of configurable nodes with a second node from the second group of configurable nodes, and (ii) a second direct offset connection that connects a third node from the first group of configurable nodes with a fourth node from the second group of configurable nodes,
    wherein a distance between the third node and the particular location in the first direction is greater than a distance between the first node and the particular location in the first direction,
    wherein a distance between the fourth node and the particular location in the second direction is greater than a distance between the second node and the particular location in the second direction.

2. The IC of claim 1,
    wherein the set of nested direct offset connections is a first set of nested direct offset connections,
    wherein the direct offset connections in the first set are repeated across the node array to define a plurality of other sets of nested direct offset connections.

3. The IC of claim 1, wherein the first node and the third node are adjacent to each other without intervening nodes and the second node and the fourth node are adjacent to each other without intervening nodes.

4. The IC of claim 1, wherein the array is centered at the particular location.

5. The IC of claim 1, wherein the first direction is perpendicular to the second direction.

6. The IC of claim 1, wherein each particular nested direct offset connection between a pair of configurable nodes is at a greater distance from the particular location than the distance of all nested direct offset connections that are interior to that particular nested direct offset connection.

7. The IC of claim 1, wherein each direct offset connection is defined by a set of wire segments.

8. The IC of claim 7, wherein the set of wire segments of a particular direct offset connection comprises two different segments that are connected by a via.

9. The IC of claim 7, wherein at least one set of wire segments includes at least two wire segments on at least two different wiring layers of the IC.

10. The IC of claim 7, wherein the set of wire segments of a particular direct offset connection comprises a first subset of wire segments arranged in a Manhattan direction and a second subset of wire segments arranged in a non-Manhattan direction.

11. An electronic device comprising: an integrated circuit ("IC") comprising:
    a plurality of configurable nodes arranged in an array having a plurality of rows and a plurality of columns, the plurality of configurable nodes comprising a first group of configurable nodes aligned along a particular direction and a second group of configurable nodes aligned along a different direction; and
    a set of direct offset turn connections arranged across the node array in a repetitive nested architecture, each direct offset turn connection connecting a node from the first group of configurable nodes to a node from the second group of configurable nodes,
    wherein each direct offset turn connection comprises at least two wire segments that are arranged in at least two different directions and intersect to define a turn,
    wherein no direct offset turn connection overlaps with another direct offset turn connection.

12. The electronic device of claim 11, wherein the set of direct offset turn connections are symmetrically arranged across the node array.

13. The electronic device of claim 11, wherein at least one direct offset turn connection further comprises a buffer circuit.

14. The electronic device of claim 11, wherein the nodes are configurable interconnect circuits.

15. The electronic device of claim 11, wherein the nodes are switchboxes.

16. The electronic device of claim 11, wherein the set of direct offset turn connections comprises a particular connection between a first node from the first group and a second node from the second group, the first and second nodes separated by at least one of two rows and two columns in the node array.

17. The electronic device of claim 11, wherein the set of direct offset turn connections comprises Manhattan and non-Manhattan connections, wherein for at least one Manhattan connection, a first wire segment of the two wire segments is arranged vertically and a second wire segment of the two wire segments is arranged horizontally.

18. The electronic device of claim 11, wherein the two wire segments of a particular direct offset turn connection comprise a first wire segment arranged in a Manhattan direction and a second wire segment arranged in a non-Manhattan direction.

19. The electronic device of claim 11, wherein a first wire segment of the two wire segments of a particular direct offset turn connection is on a first wiring layer of the IC and a second wire segment of the particular direct offset turn connection is on a second different wiring layer of the IC.

20. The electronic device of claim 11, wherein the two wire segments of a particular direct offset turn connection are connected by a via.

* * * * *